(12) United States Patent
Mizouchi

(10) Patent No.: US 6,259,512 B1
(45) Date of Patent: Jul. 10, 2001

(54) ILLUMINATION SYSTEM AND EXPOSURE APPARATUS HAVING THE SAME

(75) Inventor: Satoru Mizouchi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/127,953

(22) Filed: Aug. 3, 1998

(30) Foreign Application Priority Data

Aug. 4, 1997 (JP) .................................................. 9-221948

(51) Int. Cl.[7] ............................ G03B 27/72; G03B 27/54
(52) U.S. Cl. ................................. 355/67; 355/53; 355/71
(58) Field of Search ................................ 355/53, 67, 71; 362/268

(56) References Cited

U.S. PATENT DOCUMENTS

| | | | |
|---|---|---|---|
| 5,153,773 | 10/1992 | Muraki et al. | 359/619 |
| 5,305,059 | 4/1994 | Kurosawa | 355/208 |
| 5,345,292 | 9/1994 | Shiozawa et al. | 355/67 |
| 5,452,054 | * 9/1995 | Dewa et al. | 355/67 |
| 5,463,497 | 10/1995 | Muraki et al. | 359/618 |
| 5,673,102 | 9/1997 | Suzuki et al. | 355/53 |
| 5,675,401 | * 10/1997 | Wangler et al. | 355/67 |
| 5,684,567 | * 11/1997 | Shiozawa | 355/67 |
| 5,719,704 | * 2/1998 | Shiraishi et al. | 355/67 |

FOREIGN PATENT DOCUMENTS

| | | |
|---|---|---|
| 64-913 | 1/1989 | (JP) . |
| 3-215930 | 9/1991 | (JP) . |
| 4-329623 | 11/1992 | (JP) . |
| 5-251308 | 9/1993 | (JP) . |
| 5-283317 | 10/1993 | (JP) . |
| 6-204114 | 7/1994 | (JP) . |

* cited by examiner

Primary Examiner—Alan A. Mathews
(74) Attorney, Agent, or Firm—Fitzpatrick, Cella, Harper & Scinto

(57) ABSTRACT

An illumination system includes a light mixing system for mixing light from a light source and emitting the mixed light, a multi-beam producing system for wavefront dividing the light from the light mixing system and for producing plural light beams, an imaging system for forming an image of a light exit surface of the light mixing system on a light entrance surface of the multi-beam producing system, an illuminating system for illuminating a surface to be illuminated, with plural light beams from the multi-beam producing system in a state in which the light beams are superposed one upon another, and an adjusting system for adjusting a light quantity distribution upon the light entrance surface of the multi-beam producing system.

34 Claims, 26 Drawing Sheets

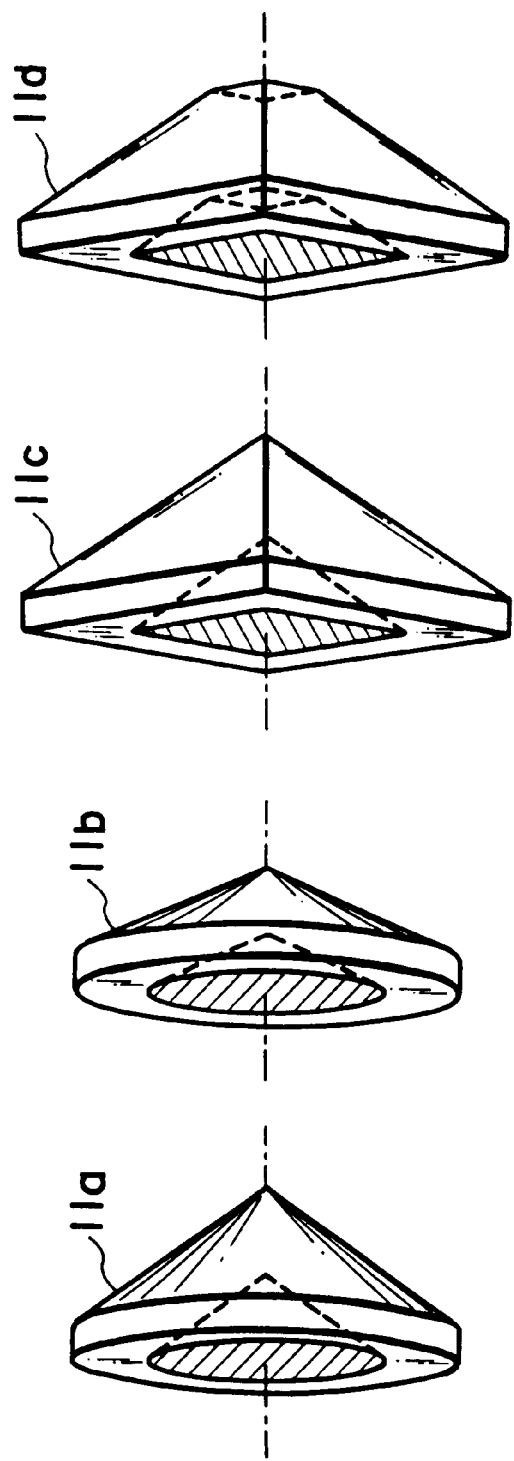

ILLUMINATION SYSTEM AND EXPOSURE APPARATUS HAVING THE SAME

FIELD OF THE INVENTION AND RELATED ART

This invention relates to an illumination system, a projection exposure apparatus having the same, and a device manufacturing method using the same. More particularly, the invention is suitably usable in the manufacture of devices such as semiconductor devices, and applicable to a step-and-repeat type or step-and-scan type projection exposure apparatus, for example, to assure suitable illumination of a pattern on a reticle surface and thus high resolving power For illumination systems to be used in an exposure apparatus for the manufacture of devices such as semiconductor devices, generally removal of non-uniformness of illuminance upon the surface of a mask (reticle) is strongly required to attain a high resolving power. Japanese Laid-Open Patent Application, Laid-Open No. 913/1989 shows an illumination system which, to meet the above requirement, proposes an attempt to increase the light collection efficiency.

FIG. 34 is a schematic view of a main portion of an illumination system proposed in this document. Denoted in the drawing at 1 is a light source which comprises an ultra-high pressure Hg lamp, for example. Denoted at 2 is light collecting means which comprises an elliptical mirror, for example. The light source 1 is disposed adjacent to a first focal point of the elliptical mirror 2. Denoted at 3 is light mixing means which comprises an optical pipe of a predetermined shape, having a light entrance surface 3a disposed adjacent to a second focal point of the elliptical mirror 2. Denoted at 4 is a condensing lens, and denoted at 5 is multi-light beam producing means which comprises a fly's eye lens. The condensing lens 4 is so set that the light exit end 3b of the optical pipe 3 and the light entrance surface 5a of the fly's eye lens 5 are placed substantially in an optically conjugate relation with each other. Also, optical constants of the condensing lens 4 are determined so that the light exit end 3b is imaged on the light entrance surface 5a at a predetermined magnification.

Denoted at 6 is illuminating means which includes a condenser lens and which serves to illuminate a surface 7 to be illuminated (such as the surface of a mask or reticle) with light from the light exit surface 5b of the fly's eye lens 5.

The light convergence point (rear focal point) of the element lenses, constituting the fly's eye lens 5, is approximately registered with the front focal point of the light collecting means 6. Also, the surface 7 to be illuminated and the rear focal point of the light collecting means 6 are approximately registered with each other. Thus, a Koehler illumination system is provided.

The optical pipe 3 which is light mixing means serves to define a number of virtual or real light convergent points from a single light flux, on the basis of multiple reflection by an inside surface thereof. The principle is illustrated in FIGS. 35–37.

For example, the optical pipe may be made of a hollow member having a square sectional shape, as shown in FIG. 37, for providing inside reflection.

FIG. 35 shows formation, upon a sectional plane along an optical axis, of virtual light convergence points by converged light having a light source image S0 in front of the light entrance surface 301a of the optical pipe 3. Among the light rays coming from the light source image S0, those which are never reflected by any of an upper side face 301c and lower side face 301d, go directly out of the light exit surface 301b. The light reflected once only by the upper side face 301c goes out as if it is supplied from a virtual light convergent point S1 which is optically conjugate with the convergence point S0 with respect to the upper side face 301c. Also, the light reflected once only by the lower side face 301d goes out as if it is supplied from a virtual light convergence point S-1 which is optically conjugate with the convergence point S0 with respect to the lower side face 301d.

Similarly, the light reflected by the lower side face 301d and then by the upper side face 301c goes out as if it is supplied from the light convergence point S2. The light reflected by the upper side face 301c and then by the lower side face 301d goes out as if it is supplied from the convergence point S-2.

Thus, the light entering the optical pipe and having the light source image S0 goes out from the pipe, through single or plural reflections at side faces, as if it is supplied from substantially a number of light sources. As a result of this, the points of light convergence as seen from the light exit surface are such as shown in FIG. 36 wherein the light exit surface 301b is illuminated with lights from a number of light convergence points distributed in a matrix. Thus, a substantial surface light. source is defined on the surface S where these-virtual light convergence points are formed. Consequently, a substantially uniform illuminance distribution can be produced on the light exit end 301b of the optical pipe 3. The degree of uniformness is determined by the number of reflections of light inside the optical pipe, although a detailed description thereof is omitted here.

The fly's eye lens 5 comprises a plurality of arrayed small lenses, and a secondary light source plane is defined at its light exit surface 5b. As described above, the light exit surface 301b of the optical pipe 3 and the light entrance surface 5a of the fly's eye lens 5 are disposed substantially in a conjugate relation with each other. While a substantially uniform illuminance distribution is produced at the light exit surface 3b of the optical pipe 3, it is directed to the fly's eye lens 5 and, through the illuminating means 6, it is projected to the surface 7 in Koehler illumination, whereby a more uniform illuminance distribution is produced on the surface 7.

The required resolution of projection exposure apparatuses is increasing with a recent enlargement of the density of a semiconductor device. For improvement of resolution, many attempts have been made such as shortening of a wavelength of a light source, use of, a phase shift mask, or use of a modified illumination method. Particularly, the modified illumination method has an advantage that it does not need a large change to conventional systems and additionally it can be applied directly to conventional mask patterns.

As representative examples of the modified illumination method, generally there are two methods; a method called a quadruple-pole illumination method wherein, upon a predetermined plane in an illumination optical system which is substantially optically conjugate with a pupil of a projection optical system, the passage of light is limited to four locations spaced from the optical axis; and a method called a ring-like zone illumination method wherein, upon a predetermined plane of an illumination system, like the above-described plane, the passage of light is limited to ring-like zones concentric with the optical axis.

The quadruple-pole illumination method has a significant effect of improvement of resolution and enlargement of depth of focus, particularly for a pattern which comprises lateral and longitudinal lines. However, for a pattern having obliquely extending lines, the result will be inferior even to that of an ordinary illumination method without such a modified illumination.

As for a ring-like zone illumination method, on the other hand, while the effect of improvement of resolution and enlargement of depth of focus is not so significant as compared with the quadruple illumination method, it has an advantage of being free from the direction of a pattern.

Japanese Laid-Open Patent Application, Laid-Open No. 251308/1993 shows an illumination system based on a modified illumination method, wherein ring-like light converting means for transforming parallel light into ring-like light is provided between light source means and an integrator, for uniform and oblique illumination of a surface to be illuminated.

Japanese Laid-Open Patent Application, Laid-Open No. 283317/1993, corresponding to U.S. Pat. No. 5,345,292, or Japanese Laid-Open Patent Application, Laid-Open No. 204114/1994 shows an arrangement wherein an optical element for deflecting input light to a predetermined direction is demountably mounted between an elliptical mirror and an optical integrator, to change the light intensity distribution on the light entrance surface of the optical integrator, for illumination of a surface to be illuminated.

SUMMARY OF THE INVENTION

It is an object of the present invention to provide an illumination system by which a surface to be illuminated can be illuminated uniformly and with a high illumination efficiency, even when an ordinary illumination method and a modified illumination method, for example, are used alternately or selectively.

It is another object of the present invention to provide a projection exposure apparatus and/or a device manufacturing method which uses an illumination system such as above.

In accordance with an aspect of the present invention, there is provided an illumination system, comprising: light mixing means for mixing light from a light source and emitting the mixed light; multi-beam producing means for wavefront dividing the light from said light mixing means and for producing plural light beams; imaging means for forming an image of a light exit surface of said light mixing means on a light entrance surface of said multi-beam producing means; illuminating means for illuminating a surface to be illuminated, with plural light beams from said multi-beam producing means in a state in which the light beams are superposed one upon another; and adjusting means for adjusting a light quantity distribution upon the light entrance surface of said multi-beam producing means.

In accordance with another aspect of the present invention. there is provided an illumination system, comprising: a first optical integrator of an inside reflection type, for reflecting at least a portion of received light by its inside surface and for defining a plane light source at or adjacent to a light exit surface thereof; a second optical integrator of a wavefront division type, for dividing the wavefront of received light and for defining plural light sources at or adjacent to a light exit surface thereof; an imaging optical system for imaging said plane light source at or adjacent to a light entrance surface of said second optical integrator; a collecting optical system for superposing lights from said plural light sources one upon another on a surface to be illuminated; and adjusting means for adjusting a light quantity distribution upon the light entrance surface of said second optical integrator.

In accordance with a further aspect of the present invention, there is provided an illumination system, comprising: a wavefront division type optical integrator for dividing a wavefront of received light and for defining plural light sources at or adjacent to a light exit surface thereof; an illumination optical system of a variable focal length for directing-light from a light source to a light entrance surface of said wavefront division type optical integrator, wherein a change in focal length of said illumination optical system is contributable to change at least one of a size and an intensity distribution of light from the light source upon said wavefront division type optical integrator; a collecting optical system for superposing lights from said plural light sources one upon another on a surface to be illuminated; and adjusting means for adjusting to light quantity distribution on said second optical integrator; wherein said illumination optical system is operable to correct the numerical aperture of light impinging on said wavefront division type optical integrator as changed with the change in focal length.

In accordance with a yet further aspect of the present invention, there is provided an illumination system, comprising: a first optical integrator of a wavefront division type, for dividing the wavefront of received light and for defining plural light sources at or adjacent to a light exit surface thereof; a second optical integrator of an inside reflection type, for reflecting at least a portion of received light by its inside surface and for defining a plane light source of a uniform intensity distribution, at or adjacent to a light exit surface thereof: a third optical integrator of a wavefront division type, for dividing the wavefront of received light and for defining plural light sources at or adjacent to a light exit surface thereof; a first imaging optical system for imaging the plural light sources, defined by said first optical integrator, at or adjacent to a light exit surface of said second optical integrator; a second imaging optical system for imaging said plane light source, defined by said second optical integrator, at or adjacent to a light entrance surface of said second optical integrator; a collecting optical system for superposing lights from said plural light sources, defined by said third optical integrator, one upon another on a surface to be illuminated; and adjusting means for adjusting a light quantity distribution upon the light entrance surface of said third optical integrator.

In accordance with a still further aspect of the present invention, there is provided an exposure apparatus for transferring, by exposure, a pattern of a mask onto a wafer, said apparatus comprising: an illumination system as recited above, for illuminating the mask; and a projection optical system for projecting the pattern of the mask onto the wafer, to transfer the former to the latter.

In accordance with a yet further aspect of the present invention, there is provided a device manufacturing method, comprising the steps of: applying a resist to a wafer; transferring, by exposure, a pattern of a mask onto the wafer by use of an exposure apparatus as recited above; and developing the exposed wafer.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 3A to 3D are schematic views of variations of light adjusting means in the first embodiment of the present invention.

DESCRIPTION OF THE PREFERRED EMBODIMENTS

Figure 1:
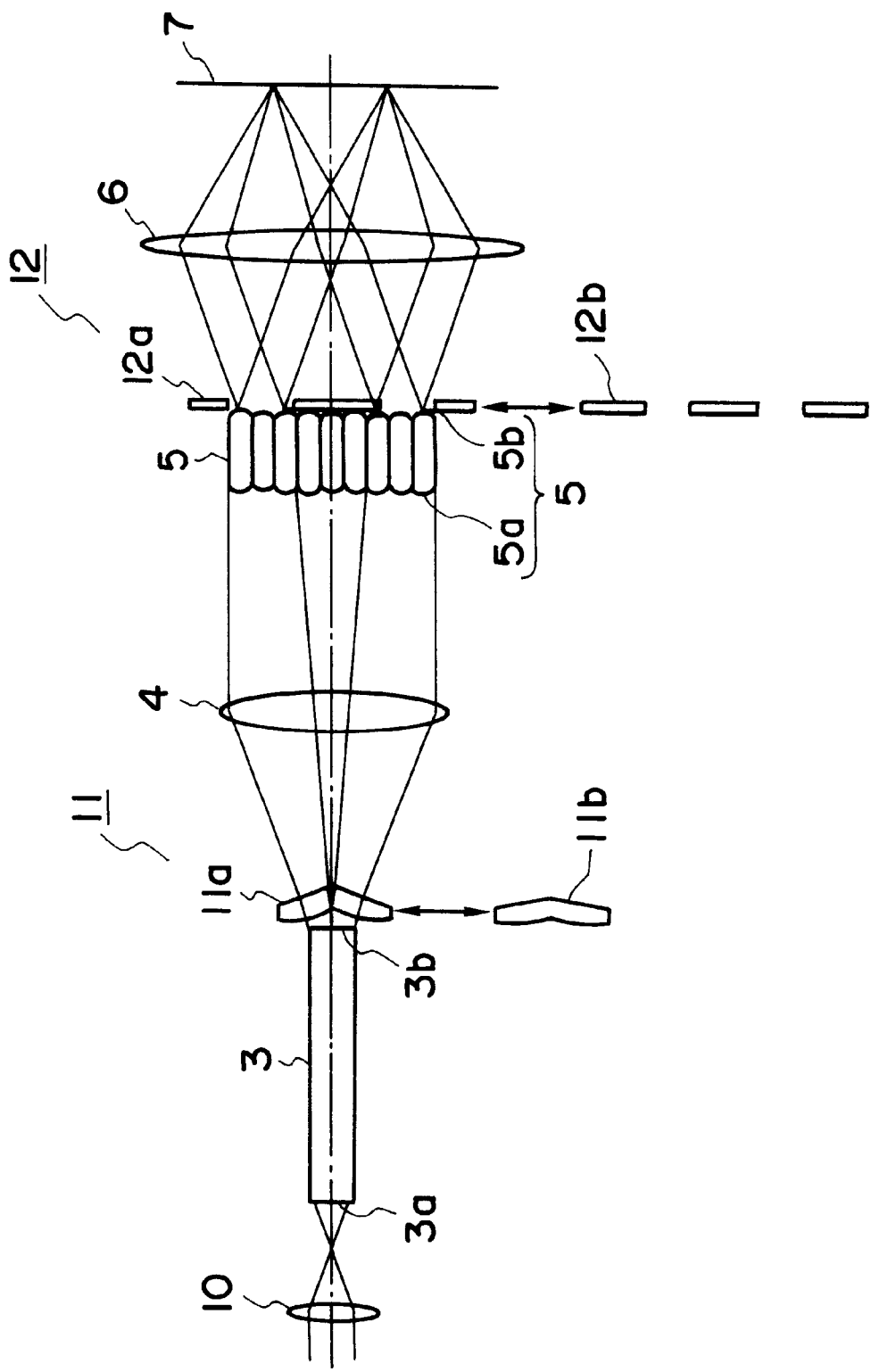
FIG. 1 is a schematic view of a main portion of an illumination system according to a first embodiment of the present invention.
Figure 2:
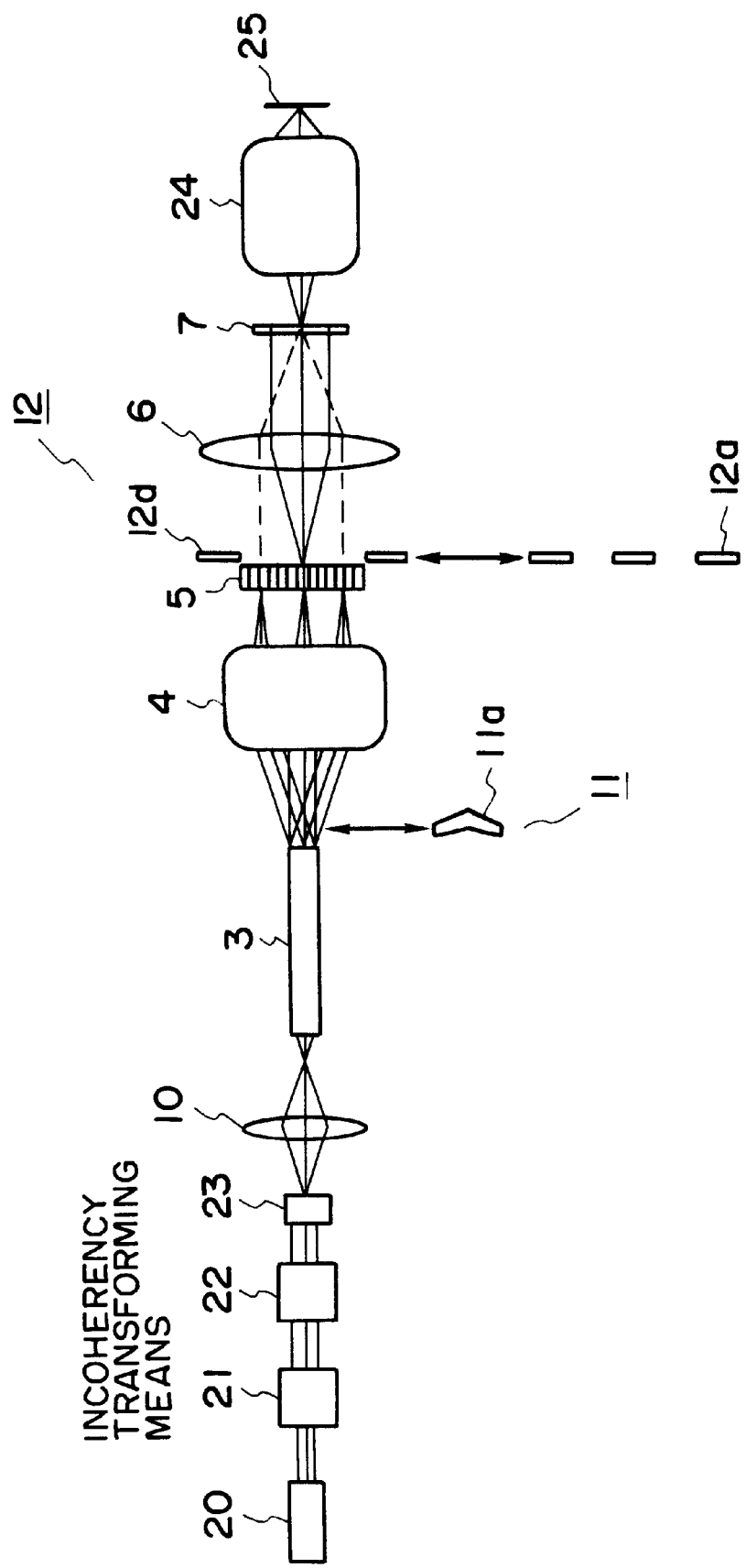
FIG. 2 is a schematic view of a main portion of a projection exposure apparatus having an illumination system according to the first embodiment of the present invention.
Figure 4A:
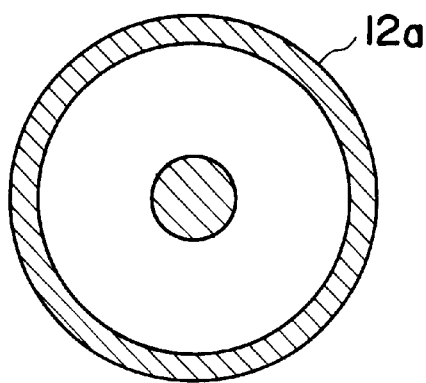
FIGS. 4A–4D are schematic views, respectively, of variations of stop means in the first embodiment of the present invention.
Figure 4B:
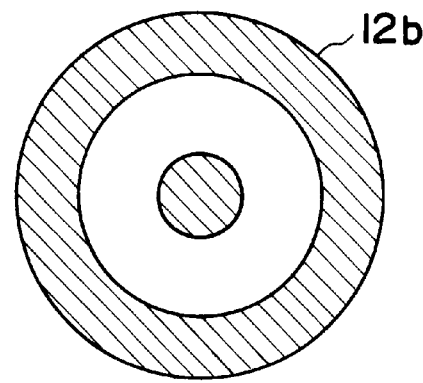
Figure 4C:
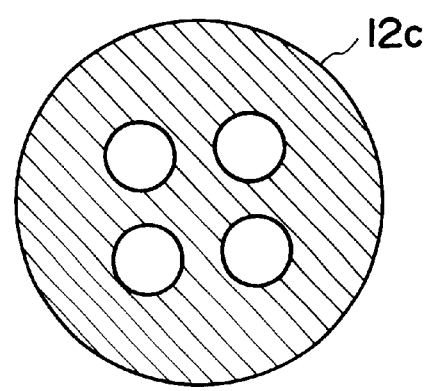
Figure 4D:
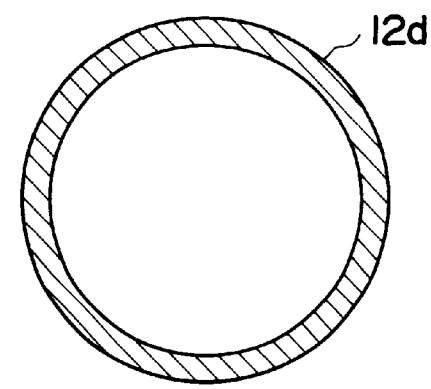

FIG. 1 is a schematic view of a main portion of an illumination system according to a first embodiment of the present invention, and FIG. 2 is a schematic view of a main portion of a projection exposure apparatus which includes an illumination system according to the first embodiment. The projection exposure apparatus of FIG. 2 can be of a step-and-repeat type or a step-and-scan type.

Denoted in these drawings at 20 is a light source which may comprise an excimer laser or an ultra-high pressure Hg lamp, for example, for providing ultraviolet rays or deep ultraviolet rays, for example. The present embodiment will be described with reference to an example wherein an excimer laser is used as a light source. The light emitted by the light source 20 enters light shaping means 21 by which it is transformed into a desire light shape. After this, the light is received by incoherency transforming means 22, whereby the light is transformed into light of low coherency. Then, the light is received by an emission angle conservation optical element 23 by which an adverse effect due to vibration between the light source 20 and the projection exposure apparatus, for example, is removed. Subsequently, the light enters a condensing or collecting optical system 10.

The light from the emission angle conservation optical element 23 is converged by the collecting optical system 10, whereby a light spot is formed. After this, the light impinges on a light entrance surface 3a of an optical pipe (light mixing means) 3. Disposed adjacent to a light exit end (light exit surface) 3b of the optical pipe 3 is light adjusting means 11 which is mountable and demountable provided there for replacement. It serves to regulate or restrict, as desired, the distribution of light emerging from the optical pipe 3.

As shown at FIG. 3A and FIG. 3B the light adjusting means 11 has plural light adjusting members (prism members) 11a and 11b having a concaved conical surface at its light entrance side and a convexed conical surface at its light exit side. The light adjusting members 11a and 11b have different peak or apex angles, that is, the light adjusting member 11a has a smaller angle as compared with the light adjusting member 11b. Namely, the. former has a more acute shape than the latter. The light adjusting member 11a serves to define an illuminance distribution corresponding to a ring-like effective light source of a larger outside diameter while the light adjusting member 11b serves to define an illuminance distribution corresponding to a ring-like effective light source of a smaller outside diameter, both on a light entrance surface 5a of multi-beam producing means 5, to be described later. Denoted at 4 is a condenser lens (imaging means) for collecting light from the light adjusting means 11 to the light entrance surface 5a of the multi-beam producing means 5 which may comprise a fly's eye lens.

The condenser lens 4 serves to image the light exit surface 3b of the optical pipe 3 upon the light entrance surface 5a of the fly's eye lens 5 at a predetermined magnification, such that they are placed in a substantially optically conjugate relation with each other.

Secondary light sources are formed in the neighborhood of the light exit surface 5b of the fly's eye lens 5, and thus an effective light source of a desired shape is defined there by blocking unwanted light. Denoted at 12 is stop means having plural stop members 12a, 12b, 12c and 12d, which are mountably and demountably provided, with use of a driving mechanism, for selective use in the neighborhood of the light exit surface 5b of the fly's eye lens 5.

These stop members 12a–12d may have apertures such as shown in FIGS. 4A, 4B, 4C or 4D, wherein hatched-regions depict light blocking zones. Of these stops, the stop members 12a and 12b are suitable for ring-like zone illumination. The stop member 12c is suitable for quadruple-pole illumination, and the-stop member 12d is suitable for ordinary illumination.

Denoted at 6 is illuminating means for collecting those light rays, of the light from the light exit surface 5b of the fly's eye lens 5, which pass through the aperture of the stop 12, for Koehler illumination of the surface 7 (reticle surface) to be illuminated.

Denoted at 24 is a projection optical system for projecting a pattern of the reticle (or mask) 7 onto a substrate 25 to be exposed.

In the projection exposure apparatus according to this embodiment, the light adjusting members 11a and 11b of the light adjusting means 11 can be selectively inserted or they can be replaced by another light adjusting member, by which an illuminance distribution upon the light entrance surface 5a of the fly's eye lens 5 can be changed for modified illumination, such as ring-like illumination or quadruple illumination, for example.

In addition to it, the stop 12 may be inserted as required to the neighborhood of the light exit surface 5b of the fly's eye lens, by which unwanted light can be blocked and a desired effective light source shape can be produced accurately. Inversely, in response to the switching of an aperture shape of the stop 12, the light adjusting means 11 may operate to change the illuminance distribution on the light entrance surface 5a of the fly's eye lens 5.

The illumination system of this embodiment has further structural and functional features as follows.

The illuminance distribution defined on the light entrance surface 5a of the fly's eye lens 5 by the light adjusting means 11 varies with the shape of the light adjusting member and the optical disposition of the light adjusting member, the condenser lens 4 and the light entrance surface of the fly's eye lens 5, as well as aberration of the condenser lens 4, for example.

Figure 5:
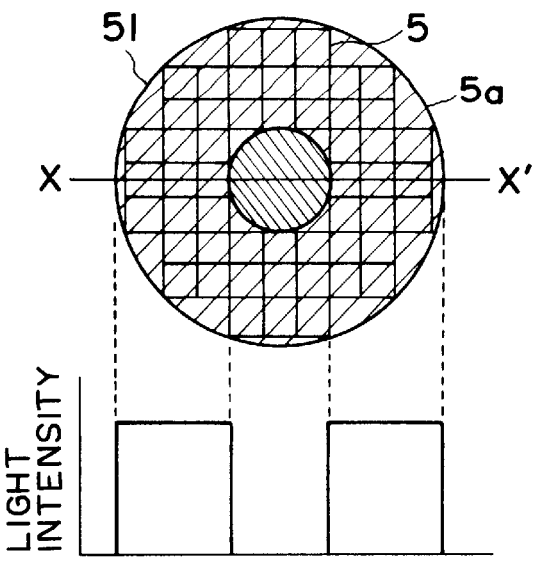
FIG. 5 is a schematic view for explaining an illuminance distribution upon a light entrance surface of a fly's eye lens used in the FIG. 1 embodiment.

When the light adjusting member 11a shown in FIG. 3A is used as the light adjusting means 11, there is a possibility that a ring-like illuminance distribution such as shown in FIG. 5 is defined on the light entrance surface 5a of the fly's eye lens 5 such that the intensity changes radically between bright and dark regions.

The portion depicted by hatching in FIG. 5 corresponds to the region illuminated with light. The light intensity in its X–X' section is illustrated in the lower part of the drawing. If the illuminance distribution such as shown in FIG. 5 is produced, then there is substantially no unwanted light produced to a desired effective light source distribution. Thus, use of the stop 12a is unnecessary.

Figure 6:
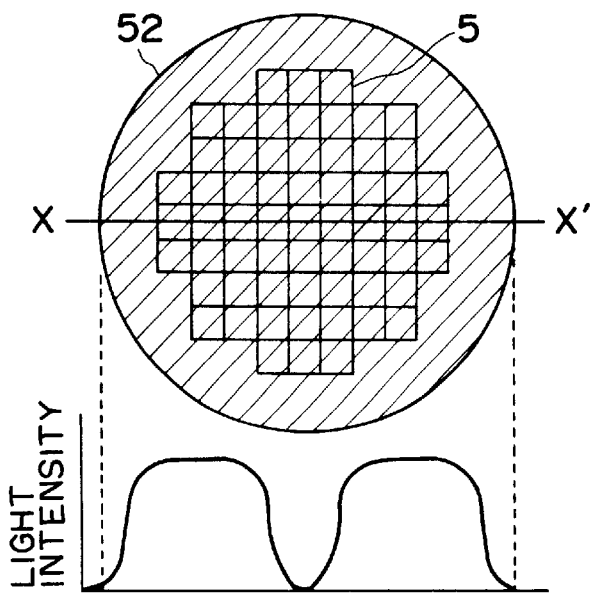
FIG. 6 is a schematic view for explaining an illuminance distribution, of another example, upon a light entrance surface of a fly's eye lens used in the FIG. 1 embodiment.

As compared therewith, depending on the illumination system, there are cases wherein the top and bottom of the section of ring-like light intensity are slowed down such as shown in FIG. 6, like a Gaussian distribution. On such an occasion, the stop 12a shown in FIG. 4A may be used to block unwanted light.

Figure 7:
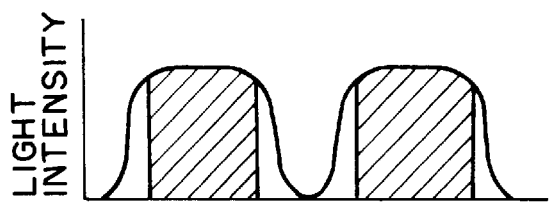
FIG. 7 is a schematic view for explaining an intensity distribution of an effective light source, in an example wherein unwanted light is blocked by a stop.

The hatching in FIG. 7 denotes the portion which is contributable to form an effective light source distribution without being blocked, as the stop 12a is used in a case wherein the light intensity distribution shown in FIG. 6 in provided by an illumination system.

Figure 8:
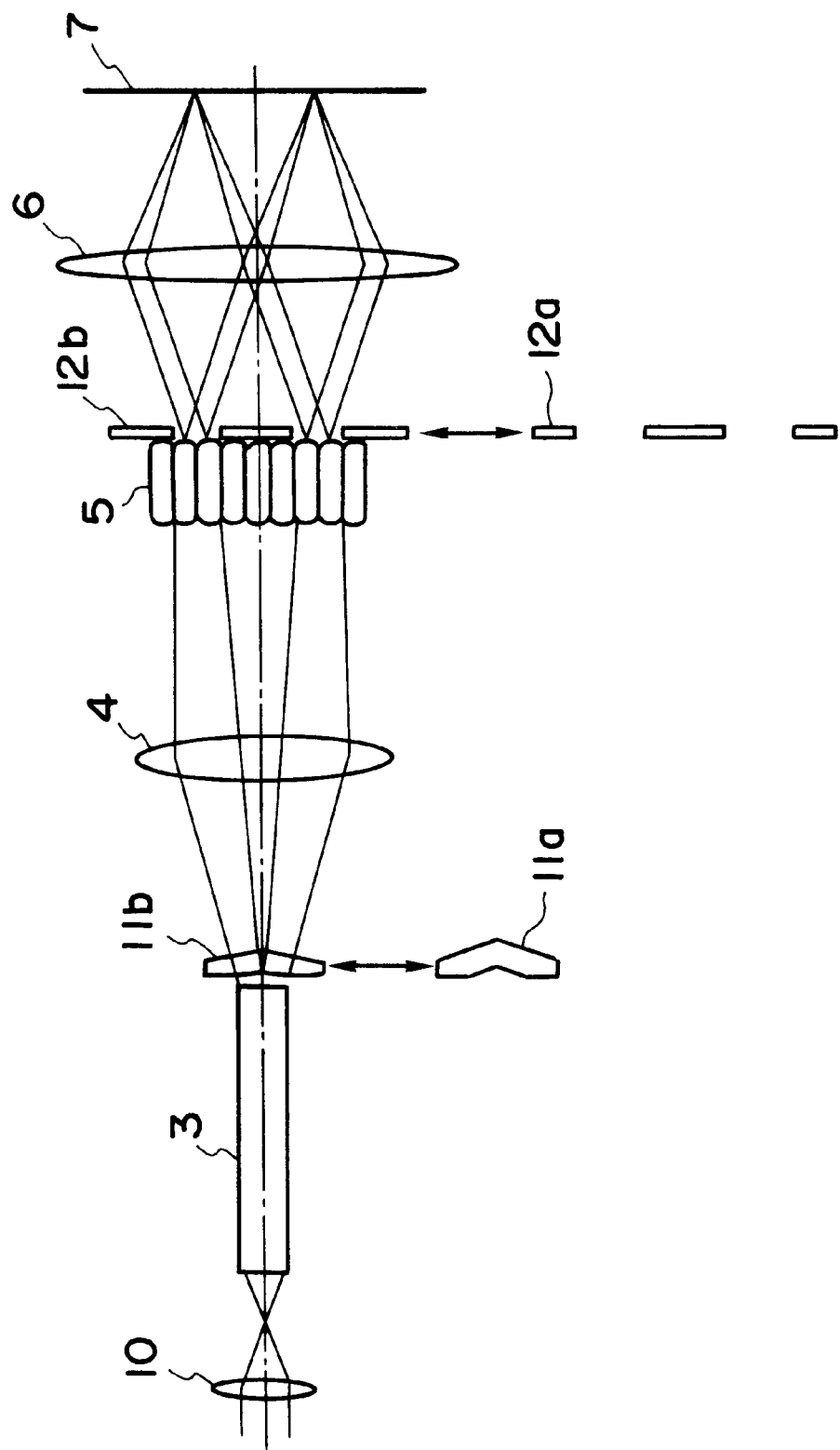
FIG. 8 is a schematic view of a main portion of an illumination system according to the first embodiment, for explaining an interchange of light adjusting means.

FIG. 8 is a schematic view for explaining a case where the light adjusting member 11a of FIG. 1 is replaced by another light adjusting member 11b.

Figure 9:
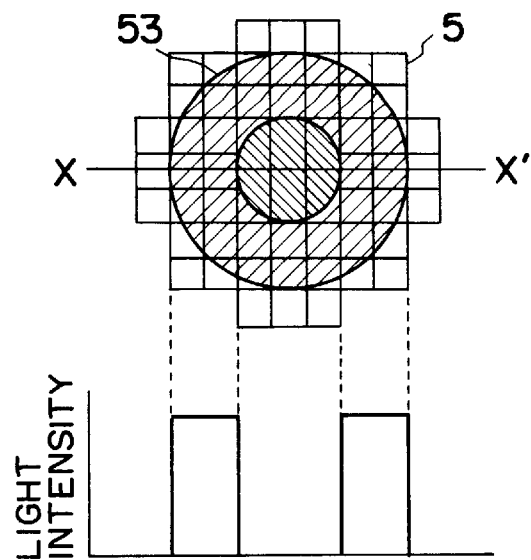
FIG. 9 is a schematic view for explaining an illuminance distribution upon a light entrance surface of a fly's eye lens used in the FIG. 8 embodiment.
Figure 10:
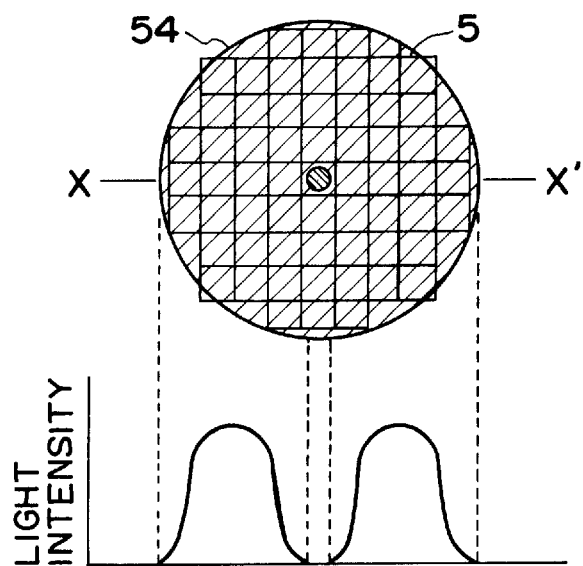
FIG. 10 is a schematic view for explaining an illuminance distribution, of another example, upon a light entrance surface of a fly's eye lens used in the FIG. 8 embodiment.
Figure 11:
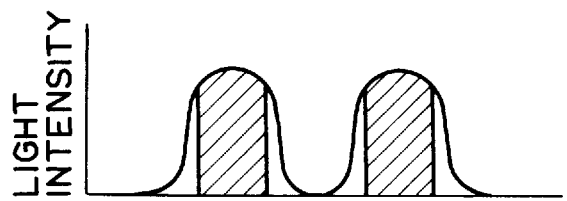
FIG. 11 is a schematic view for explaining intensity an distribution of an effective light source, in an example wherein unwanted light is blocked by a stop.

In this case, like the preceding example, there is a possibility that, as shown in FIG. 9, the dark and bright portions of the ring-like illuminance distribution upon the light entrance surface 5a of the fly's eye lens 5 change largely. On that occasion, the stop 12b is unnecessary. As compared therewith, if the intensity distribution on the light entrance surface 5a of the fly's eye lens 5 is such as shown in FIG. 10, the stop 12b may be used to block unwanted light. The hatching in FIG. 11 depicts the portion which is contributable to form an effective light source distribution without being blocked, as the stop 12b is used when a light intensity distribution such as shown in FIG. 10 is provided.

The foregoing description concerns a ring-like illumination method. However, the light adjusting means 11 may be similarly used to change the light adjusting members to meet a quadruple illumination method.

The light adjusting member 11c shown in FIG. 3C is adapted for quadruple pole illumination, and it comprises a prism member with a pyramid shape having a concave surface at the light entrance side and a convex surface at the light exit side.

Figure 12:
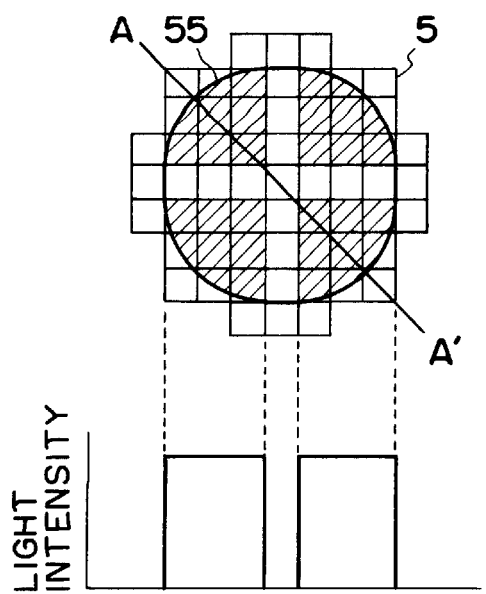
FIG. 12 is a schematic view for explaining an illuminance distribution of a light entrance surface of a fly's eye lens, in an example of quadruple-pole illumination.
Figure 13:
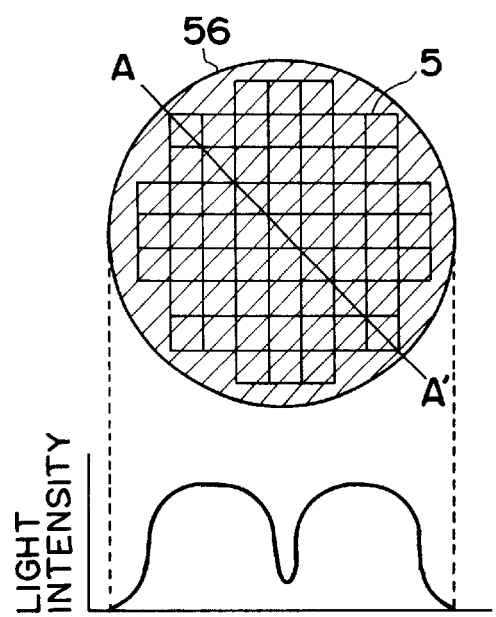
FIG. 13 is a schematic view for explaining intensity distribution of an effective light source, in an example wherein unwanted light is blocked by a stop.

With this arrangement, upon the light entrance surface 5a of the fly's eye lens 5, light is projected only on the portion shown with hatching in FIG. 12. In this case, also the stop is changed to the stop 12c shown in FIG. 4C, and an effective light source is provided only by the portion shown with hatching in FIG. 13. By this, a desired effective light source is produced. In FIGS. 12 and 13, the intensity distribution along section A–A' section is illustrated at the bottom portion thereof.

FIG. 12 corresponds to a case where the illuminance distribution at the light entrance surface 5a side of the fly's eye lens 5 changes largely between the bright region and dark region. The example wherein the distribution is like a Gaussian distribution is similar to that having been described above with reference to the ring-like illumination method. Thus, a further description thereof will be omitted here.

As regards the positions of quadruple-pole discrete intensity distributions from the optical axis, like the prism member of the ring-like illumination, the positions can be adjusted as desired by adjusting the apex angle of the pyramid.

The light adjusting member 11d shown in FIG. 3D is adapted for forming an effective light source wherein there are intensity distributions other than the quadruple pole positions, although they are low, as contrasted to an effective light source having notably discrete intensity distributions as quadruple poles.

Figure 14:
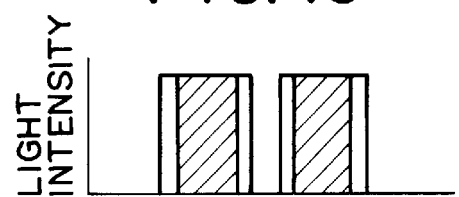
FIG. 14 is a schematic view for explaining an effective light source distribution in an example wherein light adjusting means 11d is used.

The light adjusting member shown in FIG. 3D corresponds to one which can be provided by flattening the apex points of concavity and convexity of the light adjusting member 22c shown in FIG. 3C. With this structure, the intensity distribution of light impinging on the fly's eye lens 5 will become such as shown in FIG. 14.

In accordance with this embodiment of the present invention, as described, the illumination system includes light mixing means (optical pipe) 3 and multi-beam producing means (fly's eye lens) 5, wherein light adjusting means 11 is used to selectively insert an appropriate light adjusting member corresponding to an effective light source distribution as desired, just after the light mixing means 3. With this arrangement, modified illumination of high light utilization efficiency is assured without particular adjustment of any other optical component.

Insertion of a light adjusting member may cause a change in an optical path length between the light mixing means 3 and the condenser lens 4. If this causes any inconvenience in the illumination system, a parallel flat plate having substantially the same optical path length as the light adjusting member may be used in ordinary illumination (using the stop 12d), and the light adjusting member may be replaced by another for modified illumination.

Figure 15:
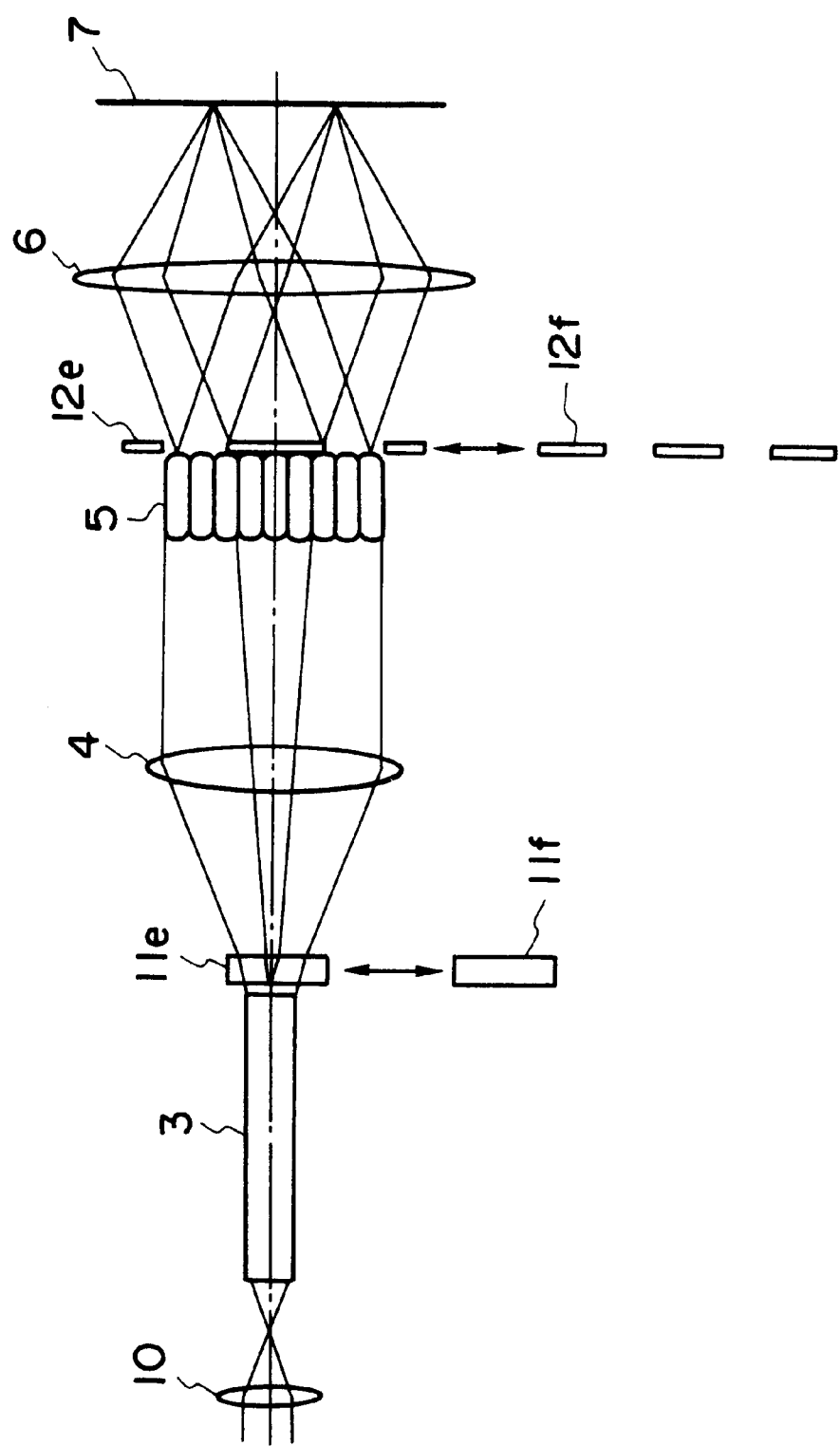
FIG. 15 is a schematic view of a main portion of an illumination system according to a second embodiment of the present invention.

FIG. 15 is a schematic view of a main portion of an illumination system according to a second embodiment of the present invention.

As compared with the illumination system of the first embodiment, the present embodiment differs in that, as the light adjusting member, diffractive optical elements 111 and 112 are provided on the top and bottom faces of a parallel flat plate 111a (FIG. 16) in place of using a prism member of a predetermined shape. The remaining portion has essentially the same structure. Like numerals as those of FIG. 1 are assigned to corresponding elements.

In this embodiment, like the first embodiment, light adjusting means 11 having light adjusting members 11e and 11f is mountably and demountably provided, for selective use, in the neighborhood of the light exit end 3b of light mixing means (optical pipe) 3. Also, there are stops 12e and 12f mountably and demountably provided, for selection, in the neighborhood of the light exit surface 5b of the fly's eye lens 5.

Figure 16:
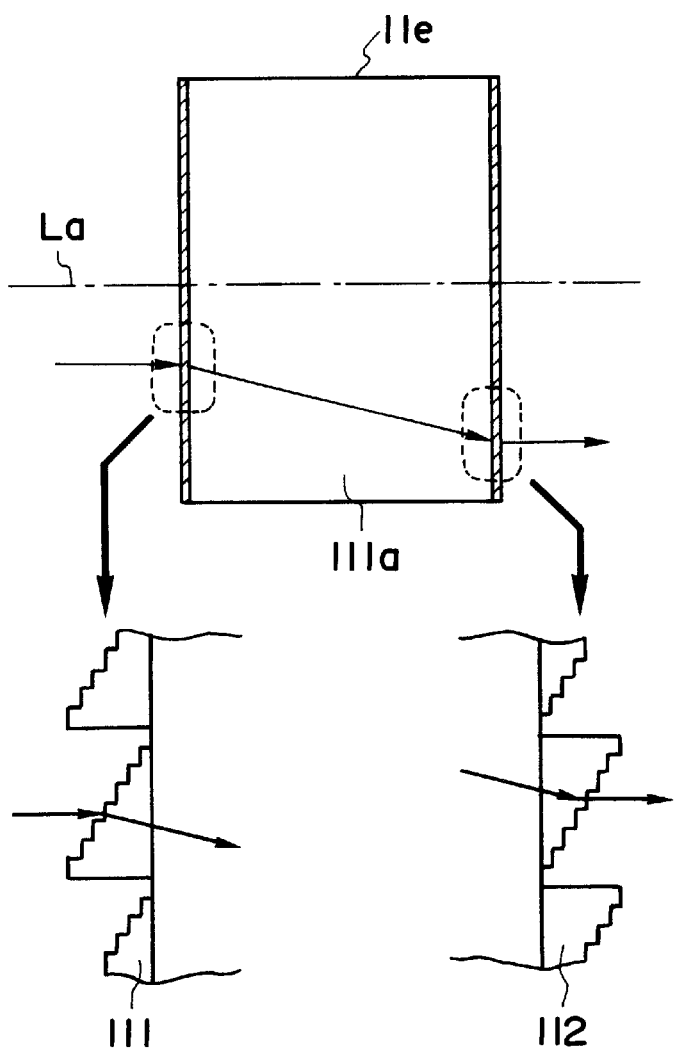
FIG. 16 is a schematic view of light adjusting means used in the second embodiment.

Each of the light adjusting members 11e and 11f comprises a parallel flat plate 111a (FIG. 16) having diffractive optical elements 111 and 112 formed on its front and rear faces. FIG. 16 includes a schematic view of the light adjusting member 11e along a sectional plane containing the optical axis, and an enlarged view thereof. The diffractive optical elements 111 and 112 of the light adjusting member 11e have a sectional shape of a blazed shape, as illustrated in the enlarged view of the drawing. Namely, the diffractive optical element 111 has a function for diffracting light in a direction opposite to the optical axis when the light is incident on the element perpendicularly. On the other hand, the diffractive optical element 112 has a function for diffracting the light toward the optical axis La side, as the light is incident on the element perpendicularly.

Figure 17:
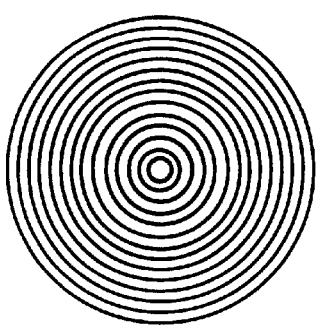
FIG. 17 is a schematic view for explaining a phase distribution of a diffractive optical element of the light adjusting means in the second embodiment.

If the light adjusting member 11e is a light adjusting member for forming ring-like illumination, for example, the phase distribution of the diffractive optical elements 111 and 112 will provide a diffractive optical element constituted by concentric circular patterns (phase distributions) about the optical axis, as shown in FIG. 17.

Figure 18:
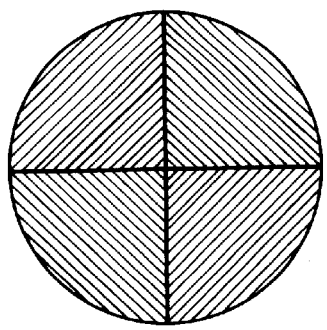
FIG. 18 is a schematic view for explaining another example of a phase distribution of a diffractive optical element of the light adjusting means in the second embodiment.

Also, if the light Adjusting member 11e is a light adjusting member for forming quadruple-pole illumination, the phase distribution of the diffractive optical elements 111 and 112 will provide a diffractive optical element having rectilinear patterns (phase distributions) orthogonally intersecting at the adjoining regions, such as shown in FIG. 18.

Figure 19:
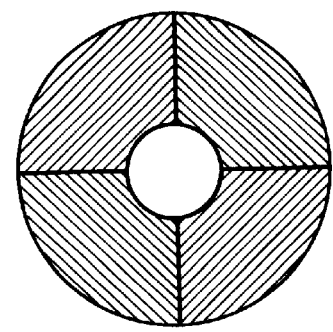
FIG. 19 is a schematic view for explaining a further example of a phase distribution of a diffractive optical element of the light adjusting means in the second embodiment.

Further, if the light adjusting member 11e is a light adjusting member for forming an effective light source distribution shown in FIG. 14, like the function of the light adjusting member 11d, the diffractive optical elements 111 and 112 will provide a diffractive optical element such as shown in FIG. 19 wherein, as compared with the rectilinear diffractive optical element of FIG. 18, the diffractive optical element has a shape not having a diffracting function at the central portion including the optical axis La.

In this embodiment, the light adjusting means having diffractive optical elements is used to adjust the intensity distribution of light impinging on the fly's eye lens 5, to provide various modified illuminations efficiently. Also, when the intensity distribution on the light entrance surface 5a of the fly's eye lens 5 has a slope as of a Gaussian distribution, the stop 12 may be provided in the neighborhood of the light exit surface 5b of the fly's eye lens 5, and it may be adjusted in response to the change of the light adjusting member by the light adjusting means 11, whereby an effective light source distribution of a desired shape can be produced.

Also, in the second embodiment as described above, the illumination system includes light mixing means 3 and multi-beam producing means 5, wherein only insertion of a light adjusting member corresponding to a desired effective light source distribution just after the light mixing means enables efficient modified illumination, without the necessity of adjustment of any other optical component.

Further, since the light adjusting member of the first embodiment comprises a prism member, it is necessary to make a prism member in accordance with the required effective light source distribution. In the present embodiment, as compared therewith, the light adjusting member is provided by a diffractive optical element. Thus, as long as the function of a diffractive optical element can be accomplished by the fine-work production technique, any light adjusting member can be manufactured easily.

In this respect, as shown in FIG. 16, the diffractive optical element may desirably be produced as a binary optical element based on optical lithographic technique, in the point of efficiency or manufacturing error. Further, from the standpoint of efficiency, a binary optical element having a stage structure not less than eight levels is preferable.

Figure 20:
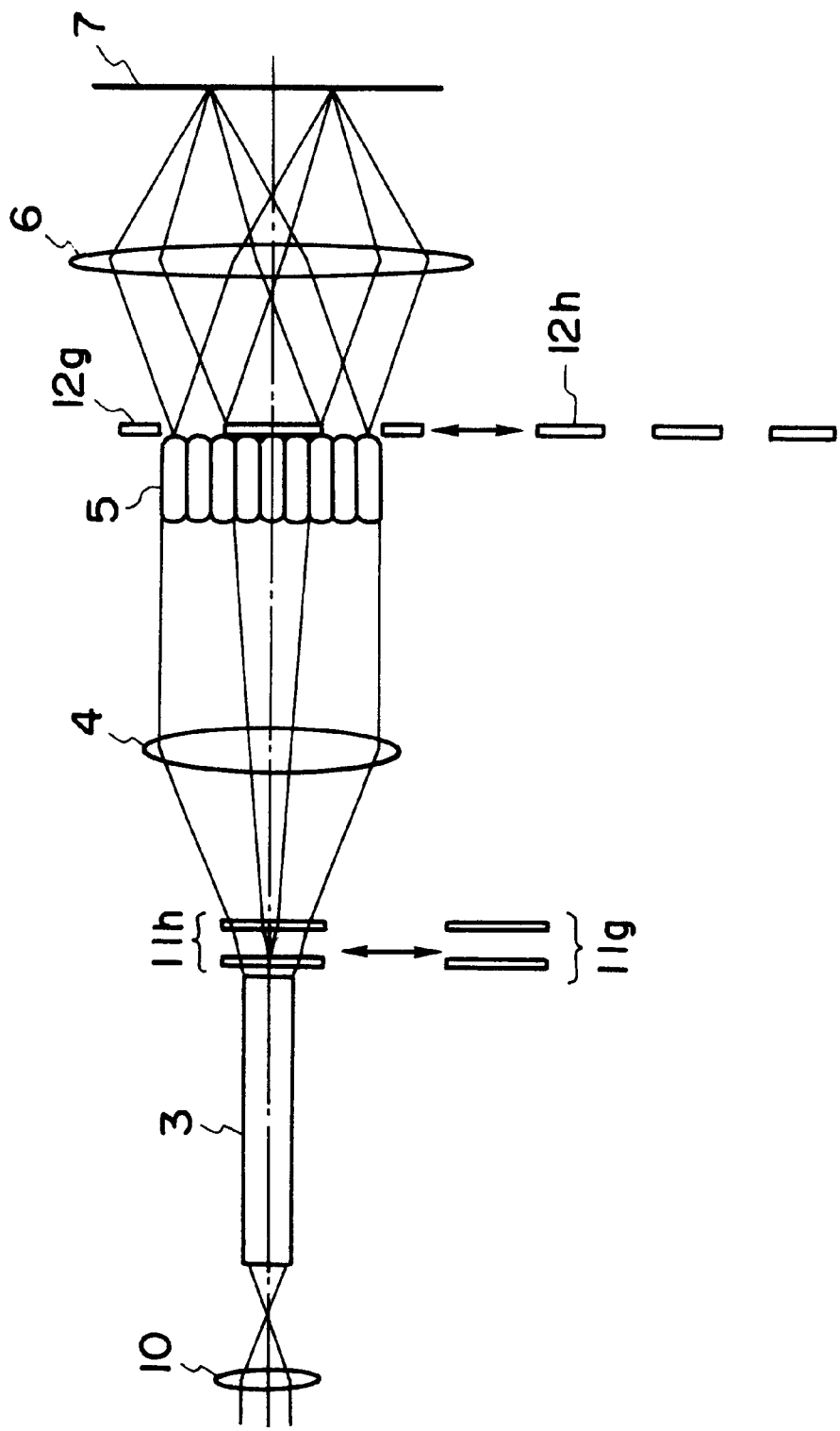
FIG. 20 is a schematic view of a main portion of an illumination system according to a third embodiment of the present invention.

FIG. 20 is a schematic view of a main portion of an illumination system according to a third embodiment of the present invention.

As compared with the second embodiment shown in FIG. 15, the present embodiment differs in that, as the light adjusting member, there are two members 111b and 112b each having a diffractive optical element 111 (112) on one side of a parallel flat plate 111a (112a) (FIG. 21), the two members being disposed opposed to each other. The remaining portion has essentially the same structure. Like numerals as of those of FIG. 15 are assigned to corresponding elements.

In this embodiment, like the second embodiment, light adjusting members 11g and 11h are mountably and demountably provided, for selective use, in the neighborhood of the light exit end 3b of light mixing means (optical pipe) 3. Also, there are stops 12g and 12h mountably and demountably provided, for selection, in the neighborhood of the light exit surface 5b of the fly's eye lens 5.

Figure 21:
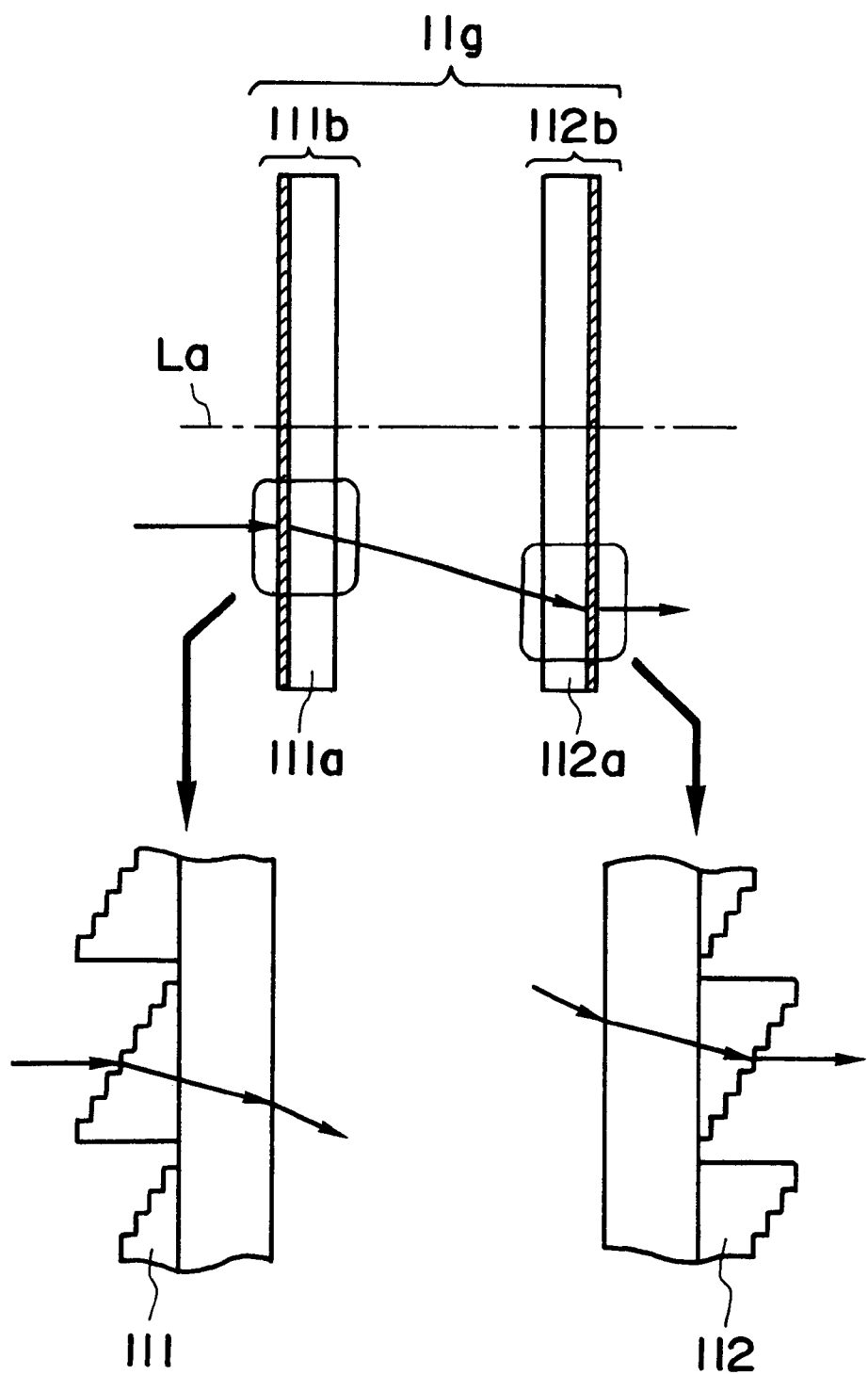
FIG. 21 is a schematic view of light adjusting means used in the third embodiment.

As shown in FIG. 21, each of the light adjusting members 11g and 11h comprises members 111b and 112b disposed opposed to each other and having parallel flat plates 111a and 112a with diffractive optical elements 111 and 112 each being provided on one side of the plate 111a or 112a. FIG. 21 includes a schematic view of the light adjusting member 11g along the section containing the optical axis La, and an enlarged view of it.

The light adjusting member 11g includes two diffractive optical elements 111 and 112. The structure is provided by a diffractive optical element blazed on the light entrance surface of the parallel flat plate 111a and a diffractive optical element blazed on the light exit surface of the parallel flat plate 112a. The remaining portion of this embodiment has essentially the same structure and function as of the second embodiment, and description thereof will be omitted here.

Also, in the third embodiment as described above, the illumination system includes light mixing means 3 and multi-beam producing means 5, wherein only insertion of a light adjusting member corresponding to a desired effective light source distribution just after the light mixing means enables efficient modified illumination, without the necessity of adjustment of any other optical component.

Further, like the second embodiment, in this embodiment, the light adjusting member is provided by a diffractive optical element. Thus, as long as the function of a diffractive optical element can be accomplished by the fine-work production technique, any light adjusting member can be manufactured easily. In this respect, the diffractive optical element may desirably be produced as a binary optical element based on an optical lithographic technique, in the point of efficiency or manufacturing error. Further, from the standpoint of efficiency, a binary optical element having a stage structure not less than eight levels is preferable.

Further, in this embodiment, the diffractive optical elements 111 and 112 are formed separately on two parallel flat plates 111a and 112a. Thus, the glass material thickness is small, such that absorption of illumination light by the glass material is reduced.

Figure 22:
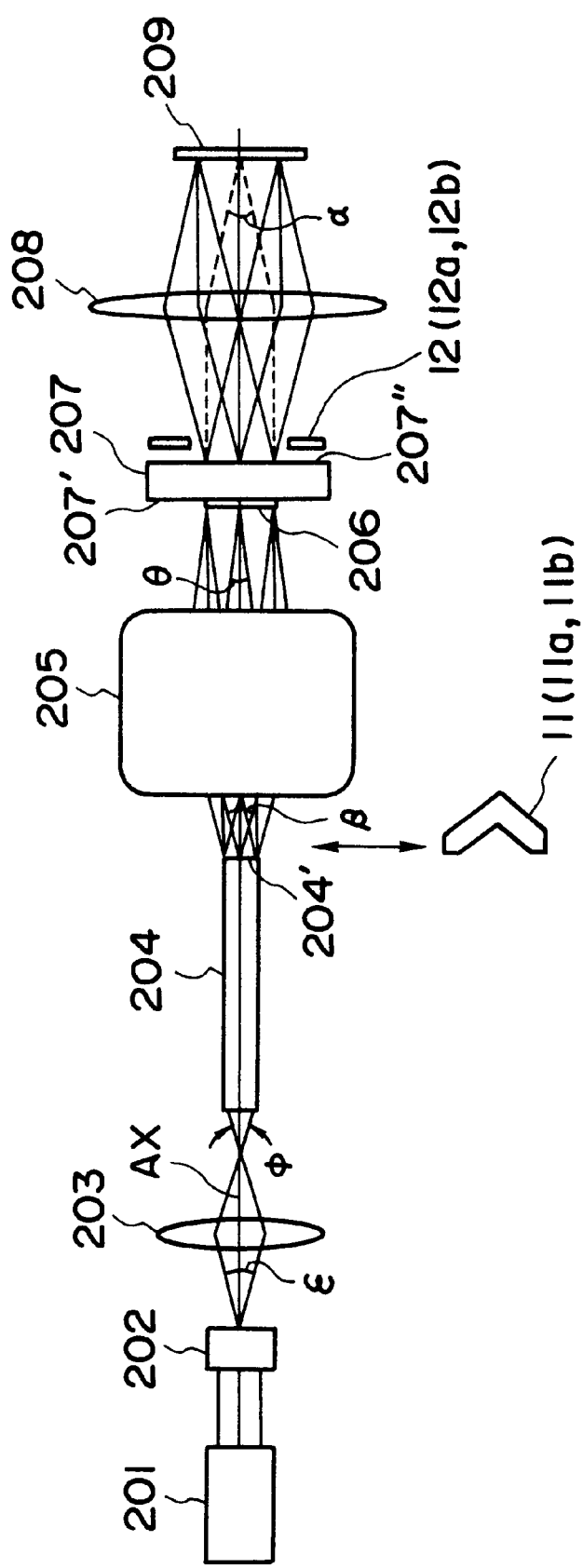
FIG. 22 is a schematic view of a main portion of an illumination system according to a fourth embodiment of the present invention.

FIG. 22 is a schematic view of a main portion of an illumination system according to a fourth embodiment of the present invention. This embodiment is applied to an illumination system to be used in a step-and-repeat type or step-and-scan type projection exposure apparatus for use in the manufacture of devices such as semiconductor chips (e.g., LSI or VLSI), CCDs, magnetic sensors, or liquid crystal devices, for example. The fourth embodiment will be described mainly with reference to the structure which differs from those of the preceding embodiments.

Denoted in FIG. 22 at 201 is a laser light source such as an ArF excimer laser (wavelength: about 193 nm) or a KrF excimer laser (wavelength: about 248 nm), for example. Denoted at 202 is an emission angle conservation optical element whereby the emission angle of light emerging therefrom is unchanged (conserved) regardless of a change in angle of incidence of light thereupon. Denoted at 203 is a condensing optical system, and denoted at 204 is light mixing means. Denoted at 205 is a zooming optical system, and denoted at 207 is multi-beam producing means. Denoted at 208 is another condensing optical system, and denoted at 209 is an object to be illuminated, such as a mask or reticle having a device pattern. Denoted at AX is an optical axis of the illumination system.

Denoted at 11 is light adjusting means, and the structure similar to any one of those having been described with reference to the preceding embodiments is applicable thereto. Denoted at 12 is a stop, and the structure similar to any one of those having been described with reference to the preceding embodiments is applicable thereto.

The condensing optical system 208 and the zooming optical system 205 basically comprise plural lens elements. In some cases, they may have at least one mirror for deflecting the light path. Also, there may be cases wherein they comprise a single lens element only. Particularly, the lens elements of the zooming optical system 205 can be moved along the optical axis AX, through a driving mechanism (not shown). By moving the lens elements along the optical axis direction in a predetermined relation, the imaging magnification can be changed while the position of the imaging plane is held fixed.

The light mixing means 204 comprises a single light pipe or a bundle of light pipes, being fixed together. The light pipe may comprise a glass rod of a polygonal prism shape or polygonal pyramid shape with its apex being cut out, which is made of a glass material (silica or fluorite) having a good transmission factor to laser light from the light source 201. Alternatively, the light pipe may comprise a hollow optical element such as a kaleidoscope having three or more flat mirrors with their reflection surfaces disposed opposed into a cylindrical shape. Such a hollow optical element may have an outside shape of a polygonal prism or polygonal pyramid with its apex being cut out. The reflection surface at the side face of the light pipe (i.e., the interface with air in the case of a glass rod, or the inside reflection surface in the case of a hollow optical element) is flat and has a high reflection factor. The light mixing means 204 serves to propagate the received light while reflecting at least a portion of the received light with its side reflection surface, and to mix the rays of the received light, whereby a surface or plane light source (light) having a uniform intensity distribution is produced at or adjacent to the light exit surface 204' thereof. Hereinafter, the light mixing means 204 or any component having the same function will be referred to as an "inside reflection type integrator".

The multi-beam producing means 207 comprises a fly's eye lens having small lenses or a bundle of optical fibers. It serves to divide the wavefront of light projected to its light entrance surface 207' and to define a plane light source (light) comprising plural point light sources, at or adjacent to its light exit surface 207". Lights from these point light sources are superposed by a subsequent optical system one upon another, whereby a plane light source (light) is produced on a predetermined plane. Hereinafter, the multi-beam producing means 207 or any component having the same function will be referred to as a "wavefront division type integrator".

Figure 23A:
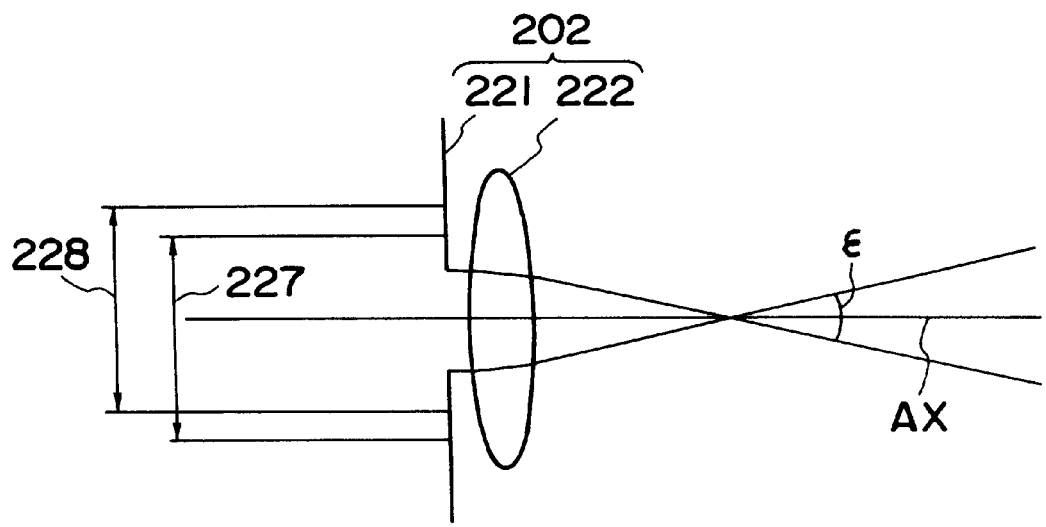
FIGS. 23A and 23B are schematic views, respectively, for explaining examples of an emission angle conservation optical element.

The laser light emitted by the laser light source 201 goes through a light guiding optical system including a mirror or relay lens (not shown), and it is received by the emission angle conservation optical element 202. As shown in FIG. 23A, the emission angle conservation means 202 comprises an aperture member 221 and a lens system 222. It has a property that, even if the incident light shifts in a direction perpendicular to the optical axis AX and within a certain range, from the state of light 227 to the state of light 228, the emission angle (opening angle) φ of light emitted from the emission angle conservation optical element 202 is kept constant.

Figure 23B:
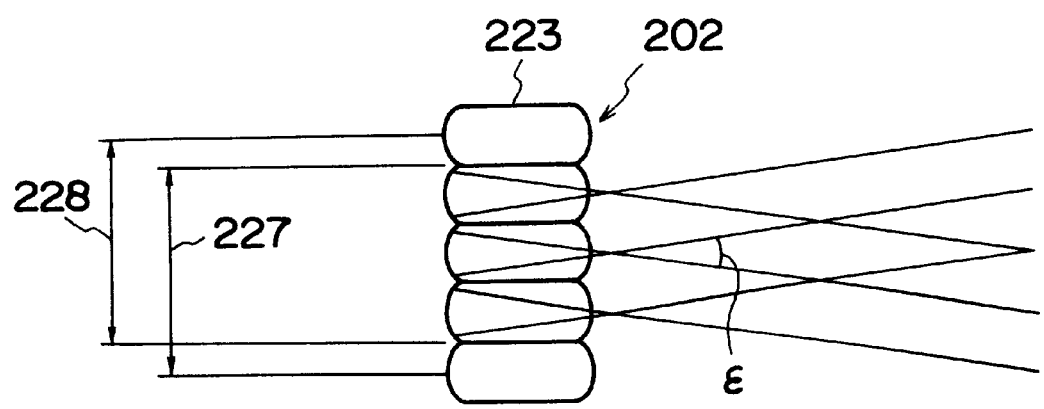

Alternatively, as shown in FIG. 23B, the emission angle conservation optical element 202 may comprise a fly's eye lens having plural small lenses 223. On that occasion, the emission angle φ depends on the shape of small lens. Also, with the optical element 202 of FIG. 23B, even if the incident light shifts in a direction perpendicular to the optical axis AX within a certain range, from the state of light 227 to the state of light 228, the emission angle (opening angle) φ of the light emitted from the emission angle conservation optical element 202 is kept constant. It is to be noted that a wavefront division type integrator other than a fly's eye lens may be used as the emission angle conservation optical element 202.

The light emitted from the emission angle conservation optical element 202 (multiple light beams in the case of a fly's eye lens) is once focused by the condensing optical system 203 at a position before the inside reflection type integrator. Thereafter, the light enters the inside reflection type integrator 204, in a state being diverged. The divergent light entering the inside reflection type integrator 204 goes therethrough while being multiply-reflected by the inside reflection surface thereof, and plural virtual images (apparent light source images) of the laser light source 201 are defined on a plate perpendicular to the optical axis AX. Thus, at the light exit surface 204' of the inside reflection type integrator 204. plural light beams apparently coming from these virtual images are superposed one upon another, such that uniform illuminance distribution is produced on the light exit surface 204'. Details of this phenomenon will be described later with reference to FIG. 25.

The shape of the inside reflection type integrator 204 may be determined while taking into account the divergence angle of laser light entering the inside reflection type integrator 24 (which angle depends on the emission angle conservation optical element 202 and the condensing optical system 203) as well as the length and width (diameter) of the inside reflection type integrator 204. Once it is determined, the optical path length differences of laser lights emitted from the virtual images and impinging on the object 209 to be illuminated can be set to not less than the coherence length, being inherent to the laser. Thus, the coherence of the laser with respect to time can be reduced, and production of speckle on the surface 209 to be illuminated can be suppressed.

Referring back to FIG. 22, the plane light source (light) having a uniform illuminance distribution (light intensity distribution) as formed on the light exit surface 204' of the inside reflection type integrator 204 goes through light adjusting means 11 and then it is imaged with enlargement by the zooming optical system 205, upon a light entrance surface 207' of the wavefront division type integrator 207, at a desired magnification. By this, a uniform light source image 206 is formed on the light entrance surface 207'.

Once the uniform light source image 206 is produced on the light entrance surface 207', the light intensity distribution upon the light entrance surface 207' is directly transferred to a light exit surface 207" of the wavefront division type integrator 207, such that a surface light source of a uniform light intensity distribution, comprising plural point light sources of substantially the same intensity, is produced at or adjacent to the light exit surface 207".

The light beams emitted from the number of point light sources at or adjacent to the light exit surface 207" go through a stop 12 and, by means of the condensing optical system 208, they are superposed one upon another on the surface 209 to be illuminated. Thus, the illuminance distribution over the whole object 209 being illuminated becomes uniform.

The "desired magnification" mentioned above corresponds to a magnification with which the size of the uniform light source image 206 is set so that the opening angle (emission angle) α of illumination light impinging on the object 209 to be illuminated has a value optimum for the exposure. If the object to be illuminated is a mask or reticle having a fine pattern, the "desired magnification" may be changed in accordance with the type of mask pattern (the magnitude of minimum pattern linewidth).

If the "desired magnification" is m, the light entrance side numerical aperture of the zooming optical system 205 which depends on the opening angle (emission angle) β of light emitted from the inside reflection type integrator 204 is NA', and the light exit side numerical aperture of the zooming optical system 205 which depends on the opening angle (incidence angle) θ of light entering the wavefront division type integrator 207 is NA", then there is a relation:

$$NA'=m \cdot NA" \qquad (1)$$

Here, from the standpoint of utilization efficiency of illumination light, the magnitude of the angle θ should preferably be within a range not exceeding the light entrance side numerical aperture NA of the wavefront division type integrator 207 and also it should be close, as much as possible, to this numerical aperture NA.

Thus, in the illumination system of this embodiment, the value of angle θ may be constantly set to an optimum angle suited to the light entrance side numerical aperture of the wavefront division type integrator 207, regardless of a change in magnification m.

Namely, if the exposure condition such as the type of mask, for example, changes so that the value of optimum magnification m of the zooming optical system 205 has to be changed by an amount which cannot be disregarded, also the value of the opening angle β of light to be emitted from the inside reflection type integrator 204 is changed to prevent a decrease of utilization efficiency of illumination light.

It is to be noted that once a magnification m which is optimum for the exposure under certain conditions is determined, the optimum angle for the opening angle (emission angle) β of light to be emitted from the inside reflection type integrator 204 can be determined appropriately, in accordance with equation (1).

The illumination system of this embodiment utilizes that the value of angle β is equal to the incidence angle φ of light entering the inside reflection type integrator 204 and that the incidence angle φ depends on the opening angle (emission angle) ε of light to be emitted from the emission angle conservation optical element 202. Based on this, and in accordance with the exposure condition, the emission angle conservation optical element 202 is replaced by another emission angle conservation optical element having a different emission angle ε, whereby the value of angle θ can be maintained constant or substantially constant.

The manner of changing emission angle conservation optical elements 202 will be explained with reference to FIGS. 24A and 24B.

Figure 24A:
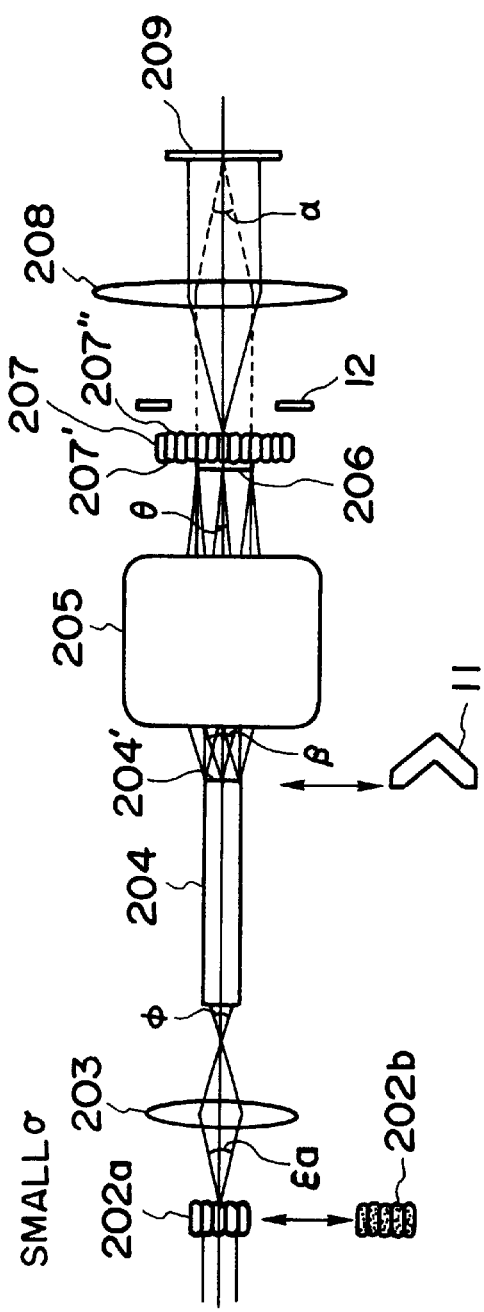
FIGS. 24A and 24B are schematic views, respectively, for explaining an interchange of emission angle conservation optical elements.
Figure 24B:
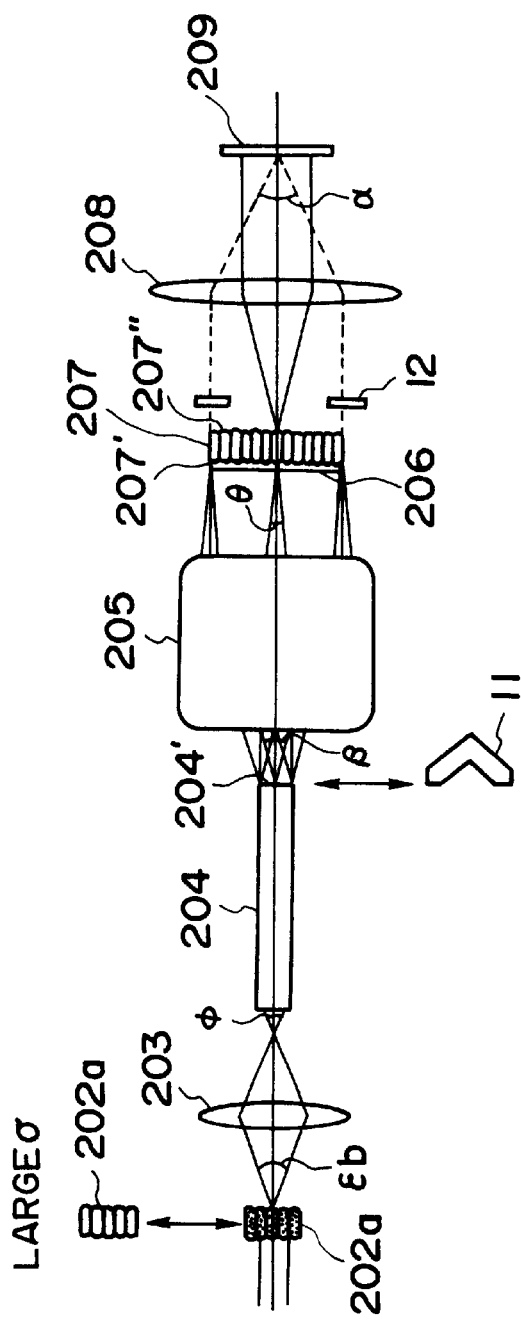

Denoted in FIGS. 24A and 24B at 202a is an emission angle conservation optical element having a smaller emission angle $\epsilon$ (=$\epsilon$a). Denoted at 202b is another emission angle conservation optical element having a larger emission angle $\epsilon$ (=$\epsilon$b). Like numerals as those of FIG. 22 are assigned to corresponding elements.

Generally, in an illumination system of a semiconductor chip manufacturing projection exposure apparatus, it is required that the opening angle (incidence angle) $\alpha$ of light impinging on the pattern bearing surface of a mask or reticle is set to an optimum angle and also that the utilization efficiency of light (i.e., the light quantity) is kept high. In the illumination system of this embodiment, in consideration of the above, a zooming optical system and a plurality of emission angle conservation optical elements are prepared, and the zooming optical system and the optical elements are interchangeably used in accordance with the necessity, such as a change in type of mask, for example.

FIG. 24A shows a case wherein the incidence angle $\alpha$ of light impinging on the mask 209 is relatively small (this is called a "small $\sigma$ (sigma) state"), and it corresponds to a case wherein the minimum linewidth of the circuit pattern of the mask 209 is relatively large, although it is within a submicron range. Here, $\sigma$ (sigma) denotes the ratio of the light exit side numerical aperture Ni of an illumination optical system and the light entrance side numerical aperture Np of a projection optical system, i.e., Ni/Np.

In order to establish a small $\sigma$ state, the light exit surface 204' (surface light source there or in the neighborhood of it) of the inside reflection type integrator 204 should be imaged on the light entrance surface 207' of the wavefront division type integrator 207 at a small magnification. This can be done by making the magnification of the zooming optical system 205 small. However, as described before, the incidence angle $\theta$ should be kept at an optimum angle dependent on the structure of the wavefront division type integrator 204. In consideration of this, to change sigma to a small $\sigma$ state, the magnification of the zooming optical system is changed to a magnification corresponding to the value of incidence angle $\alpha$ and, additionally, the emission angle conservation optical element 202b having an emission angle $\epsilon$b (>$\epsilon$a) is replaced by another emission angle conservation optical element 202a having an emission angle $\epsilon$a such that the value of incidence angle $\theta$ can be kept at an optimum value.

FIG. 24B shows a case wherein the incidence angle $\alpha$ of light impinging on the mask 209 is relatively large (this is called a "large $\sigma$ (sigma) state"), and it corresponds to a case wherein the minimum linewidth of the circuit pattern of the mask 209 is relatively small, within the submicron range. In order to establish a large $\sigma$ state, the light exit surface 204' (surface light source there or in the neighborhood of it) of the inside reflection type integrator 204 should be imaged on the light entrance surface 207' of the wavefront division type integrator 207 at a large magnification. This can be done by making the magnification of the zooming optical system 205 large. However, as described before, the incidence angle $\theta$ should he kept at an optimum angle dependent on the structure of the wavefront division type integrator 204. In consideration of this, to change sigma to a large $\sigma$ state, the magnification of the zooming optical system is changed to a magnification corresponding to the value of incidence angle $\alpha$ and, additionally, the emission angle conservation optical element 202a having an emission angle $\epsilon$a (<$\epsilon$b) is replaced by another emission angle conservation optical element 202b having an emission angle $\epsilon$b such that the value of incidence angle $\theta$ can be kept at an optimum value.

While the foregoing description has been made of an example wherein the imaging magnification of the zooming optical system and the emission angle conservation optical element are changed at two levels, they may be changed at three levels or more. Since the zooming optical system can change the magnification continuously within a certain range, changing the magnification at three or more levels is very easy. Thus, it can be used without modification. As regards the emission angle conservation optical element, three or more emission angle conservation optical elements having different focal lengths may be prepared. It is to be noted that, even with the change of emission angle conservation optical elements, the focus position of laser light (in this example, the absolute position of a real image or virtual image of a light emitting portion which is at infinity) should be kept substantially constant.

Alternatively, as the zooming optical system, plural imaging optical systems having different imaging magnifications may be prepared, and they may be selectively disposed between the two integrators 204 and 207. On the other hand, as regards the emission angle conservation optical element, a zooming optical system having plural lenses movable along the optical axis direction may be used.

Next, the reason why the illuminance distribution on the light exit surface 204' of the inside reflection type integrator becomes uniform, will be explained with reference to FIG. 25.

Figure 25:
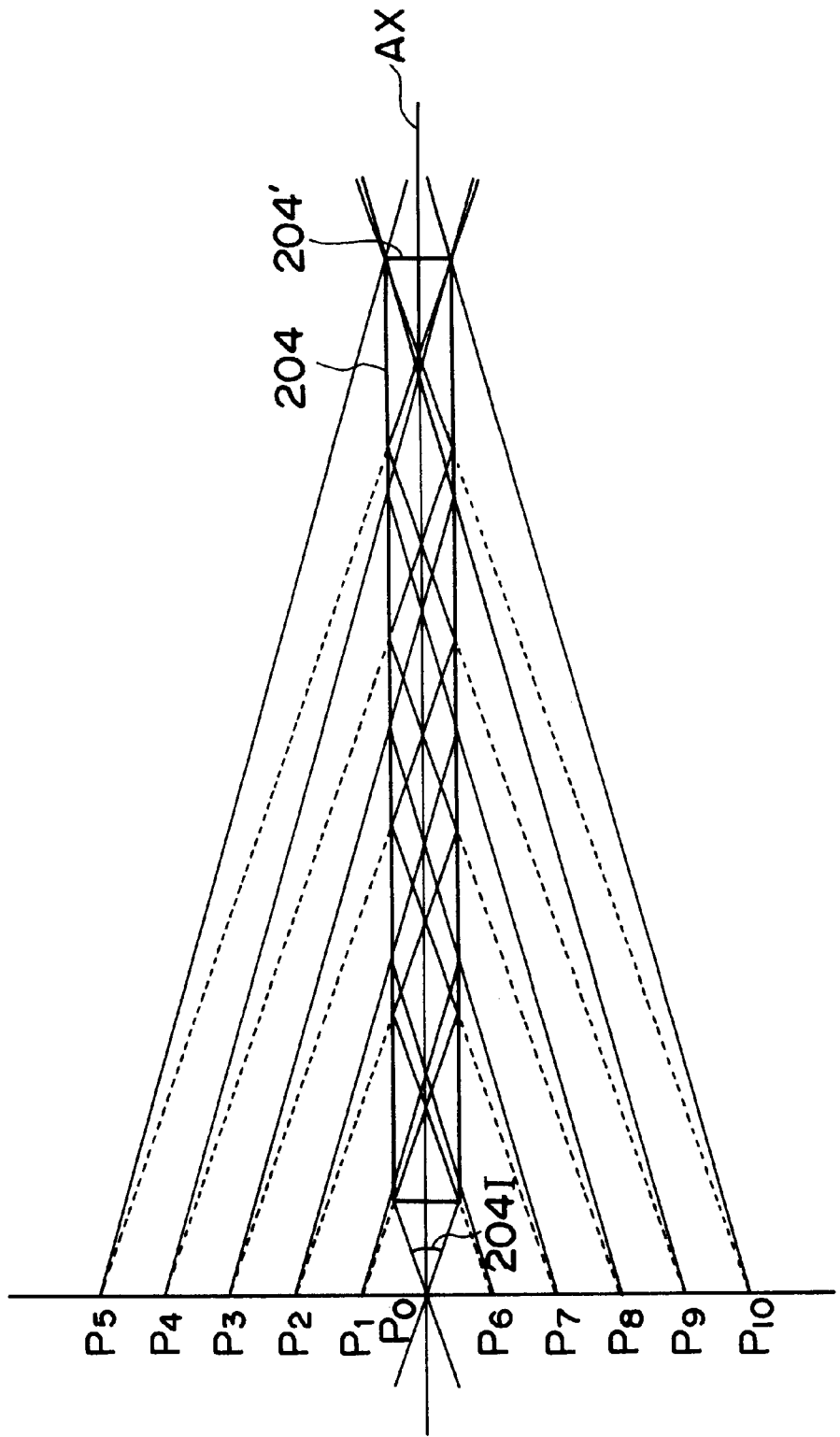
FIG. 25 is a schematic view for explaining the function of an inside reflection type integrator.

In FIG. 25, it is assumed that the inside reflection type integrator 204 comprises a glass rod of a hexagonal prism shape. FIG. 25 is a side sectional view containing the optical axis AX.

Laser light from the condensing optical system 203 (not shown in this drawing) is once focused (imaged) at a focal point P0, and then it becomes divergent light having a divergence angle $\phi$. Here, if the laser light comprises excimer laser light, since generally it has a large intensity, an enormous energy density is provided in the neighborhood of the focal point P0. which may result in damage of to the coating (anti-reflection film) on the light entrance surface of the inside reflection type integrator 204 or damage of to the glass material itself. In such a case, therefore, the inside reflection type integrator 204 may be disposed at a short distance from the focal point P0.

The divergent light entering the inside reflection type integrator 204 is passed therethrough while being repeatedly reflected (by total reflection) by the inside reflection surface, and it is emitted from the inside reflection type integrator 204 with its divergence angle 204I ($\phi$) as it has been incident being kept constant. Here, since the light beams reflected by respective portions of the inside reflection surface of the inside reflection type integrator 204 are still being divergent even after the reflection, the light beams reflected by the respective portions form virtual images P1, P2, P3, P4, P5, P6, P7, P8, P9 and P10 at rear positions, as depicted by broken lines. While not shown in the drawing, actually, in the case of a hexagonal prism glass rod, similar virtual images are formed additionally by the function of the remaining two sets of inside reflection surfaces.

Thus, at the light exit surface 204' of the inside reflection type integrator 204, a number of light beams apparently coming from these virtual images are superposed one upon another, by which a uniform illuminance distribution is produced.

Figure 26:
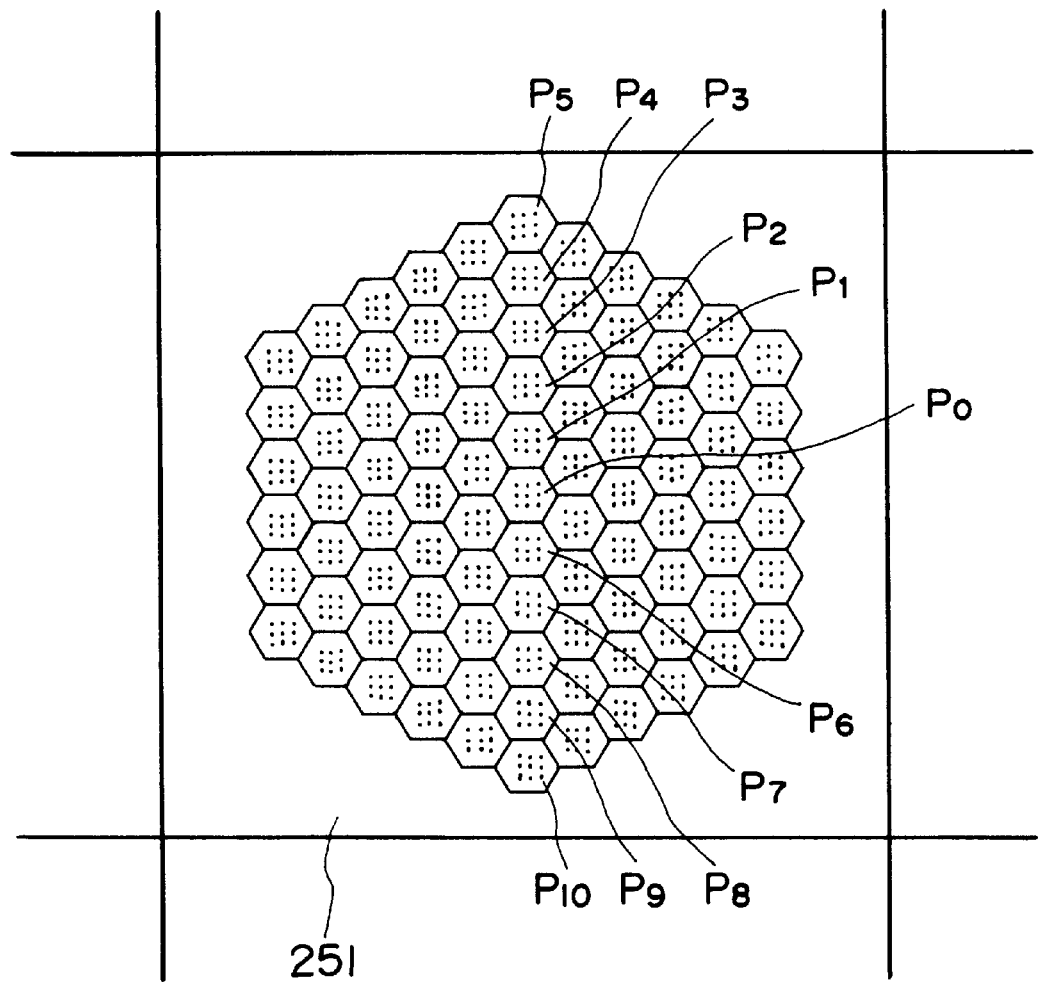
FIG. 26 is a schematic view for explaining a virtual image group as defined by an inside reflection type integrator 204.

FIG. 26 shows an example of arrayed virtual images (apparent light source images) as produced by the inside reflection type integrator 204 of FIG. 25, as it is viewed from the light exit surface of one small lens constituting the wavefront division type integrator 207 in the arrangement of FIG. 24A, for example. In FIG. 26, denoted at 251 is a small lens of the wavefront division type integrator 207, and denoted at P1–P10 are virtual images as shown in FIG. 25. It is seen from FIG. 26 that, if the inside reflection type integrator 204 comprises a hexagonal prism light pipe, the virtual image group is arrayed in a honeycomb shape; but if the inside reflection type integrator 204 comprises a quadrangle prism light pipe, the virtual image group is arrayed in a rectangular grid-like shape. These virtual images are images of spots of convergent laser light (point light sources) defined between the condensing optical system 203 and the inside reflection type integrator 204.

In the illumination system of this embodiment, as shown in FIG. 24A, the emission angle conservation optical element 202a or 202b comprises a fly's eye lens having small lenses of a number m×n (m≧2 and n≧2), such that each of the virtual images consists of images divided in a number of about m×n. Thus, a virtual image comprising divided images arrayed in a honeycomb shape can be observed, and this corresponds to one small lens of the wavefront division type integrator 207.

Thus, in the illumination system of this embodiment, when light beams from point light sources (effective light sources) as defined at or adjacent to the light exit surface 207" of the wavefront division type integrator 207 are to be superposed by the condensing optical system 208 one upon another on the surface of the object 209, to be illuminated, to illuminate the object 209, there are a large number of point light sources (effective light sources) defined. This enables illumination of the object 209 with a uniform illuminance distribution over the object 209.

Further, as has been described with reference to FIG. 23B, even if the light from the laser light source 201 shifts minutely due to an external disturbance, the emission angle ε of light from the emission angle conservation optical element 202a or 202b is kept constant. Only the divided images shown in FIG. 26 shift minutely. There is no change in the virtual image group of a honeycomb structure. Thus, viewing all the virtual images in the small lenses 215 of the wavefront division type integrator 207 as well as the emission angle conservation optical element 202a or 202b, as a whole, there is substantially no change. The influence to the illuminance distribution on the object 209 is reduced considerably to a level that can be disregarded.

As described above, the illumination system of this embodiment shows a very stable performance against a shift of laser light from the laser light source. The light adjusting means 11 and the stop 12 may have substantially the same optical functions as those of the preceding embodiments.

Figure 27:
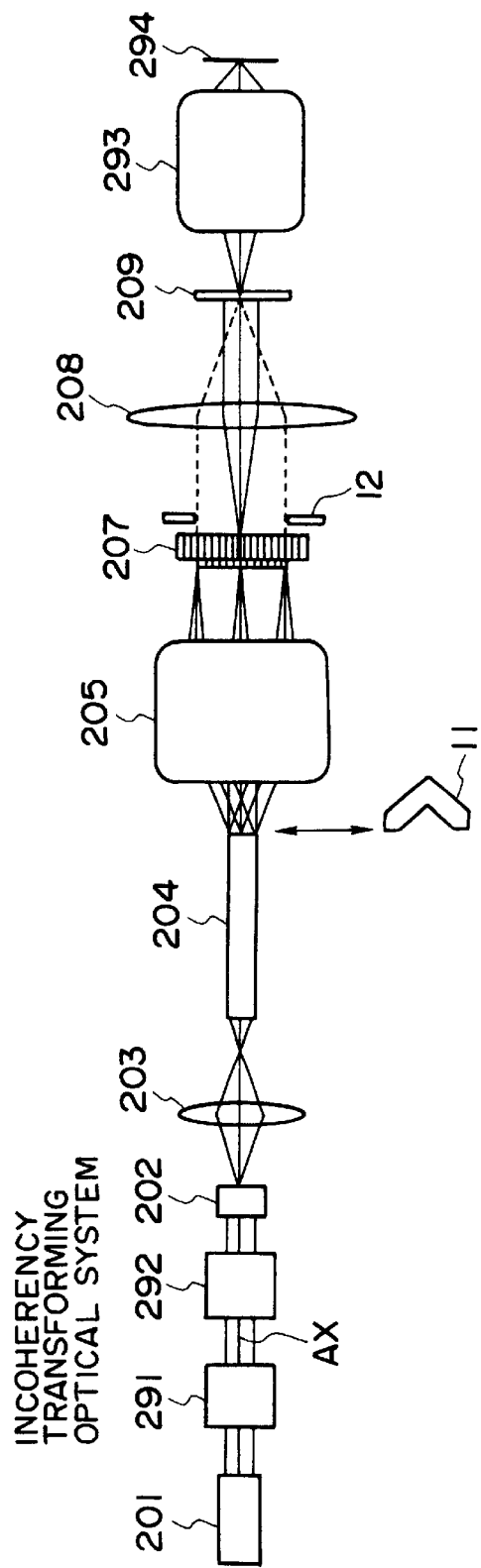
FIG. 27 is a schematic view of an exposure apparatus including an illumination system of the FIG. 22 embodiment.

FIG. 27 shows an embodiment wherein an illumination system according to the fourth embodiment is applied to a step-and-repeat or step-and-scan type projection exposure apparatus for the manufacture of semiconductor chips such as LSI or VLSI, CCDs, magnetic sensors, or liquid crystal devices, for example.

Denoted in FIG. 27 at 291 is a light shaping optical system for transforming, into a desired beam shape, parallel light coming from a laser light source 201 such as an ArF excimer laser or a KrF excimer laser, for example. Denoted at 292 is an incoherency transforming optical system for transforming coherent laser light into incoherent light. Denoted at 293 is a projection optical system for projecting a latent image or reduced image of a circuit pattern of a mask 209, for example. Denoted at 294 is a wafer having a substrate (silicon or glass) with a photosensitive material applied thereto. Like numerals as those of FIG. 22 are assigned to corresponding elements, and description thereof will be omitted.

Laser light from the laser light source 201 may have a half width of spectral bandwidth narrowed to 1–3 pm in a case where the projection optical system 293 is not corrected for chromatic aberration. If the projection optical system 293 is corrected for chromatic aberration, the half width of the spectral bandwidth may be narrowed to a certain value not less than 10 pm. Also, there may be a case wherein laser light not band-narrowed is used with a chromatic aberration corrected projection optical system 293.

As regards the projection optical system 293, an optical system consisting at lens elements only, an optical system having lens elements and at least one concave mirror, or an optical system having lens elements and at least one diffractive optical element such as a kinoform, for example, may be used. For correction of chromatic aberration, lens elements made of different glass materials having different dispersions (Abbe's numbers) may be used or, alternatively, a diffractive optical element which produces dispersion in an opposite direction of lens elements may be used.

The laser light from the laser light source 201 goes via a light guiding optical system comprising a mirror or relay lens (not shown), and it enters the beam shaping optical system 291. The beam shaping optical system 291 comprises cylindrical lenses or a beam expander, for example, and it serves to change the longitudinal-to-lateral ratio of the sectional shape of the laser light (perpendicular to the optical axis AX) to a desired value.

The light having its sectional shape adjusted by the beam shaping optical system 291 enters the incoherence transforming optical system 292 for preventing interference and speckle of light upon the wafer 294, such that it is transformed by the optical system 294 into incoherent light less causing speckle.

The incoherence transforming optical system 292 may have a structure such as disclosed in Japanese Laid-Open Patent Application, Laid-Open No. 215930/1991, U.S. Pat. No. 5,153,773 or U.S. Pat. No. 5,463,497, wherein, on a light dividing plane, light is divided into at least two light beams (e.g., P-polarized light and S-polarized light) one of which is directed through an optical member by which an optical path difference longer than the coherence length may be applied to the one light beam, relative to the other, and then it is directed back to the light dividing plane so that it is superposed on the other light beam. An optical system having at least one light returning system such as above, may be used.

The incoherent light from the incoherence transforming optical system 292 enters an emission angle conservation optical element 202. In accordance with the procedure similar to that having been described with reference to FIGS. 22–26, lights emitted from the small regions (small lenses) of the wavefront division type integrator 207 are superposed one upon another by the condensing optical system 208, to illuminate the mask 209. Thus, the mask 209 is illuminated uniformly, such that a uniform illuminance distribution is produced over the whole circuit pattern surface of the mask 209 which is to be projected. Then, the circuit pattern of the mask 209 is projected and imaged by the projection optical system 293 onto the wafer 294, such that the circuit pattern (image) is lithographically printed on the photosensitive material of the wafer 204. The wafer 294 is held fixed by an X-Y-Z movable stage (not shown) through vacuum attraction, for example, having a function for moving (translating) upwardly, downwardly, leftwardly and rightwardly, as viewed in the drawing. The movement of the stage is controlled by use of a laser interferometer (not shown). Since such a mechanism is well known in the art a description thereof will be omitted here.

In FIG. 27, an aperture stop member 12 for illumination is disposed on the light path at the light exit side of the wavefront division type integrator 207. The stop member 12 has plural aperture stops, corresponding to different σ values, formed in a disk-like member (turret), for example. By rotating the disk in response to zooming of the zooming optical system and the switching of emission angle conservation optical elements, a desired aperture stop corresponding to a σ value can be inserted to the light path at the light exit side of the wavefront division type integrator 207.

As regards the shapes of these aperture stops, ordinary circular openings, ring-like openings, or four off-axis apertures such as disclosed in Japanese Laid-Open Patent Application, Laid-Open No. 329623/1992. U.S. Pat. No. 5,305,059 or U.S. Pat. No. 5,673,102, may be used.

An illumination optical system according to a fifth embodiment of the present invention will now be described with reference to FIGS. 28A and 29B.

Figure 28A:
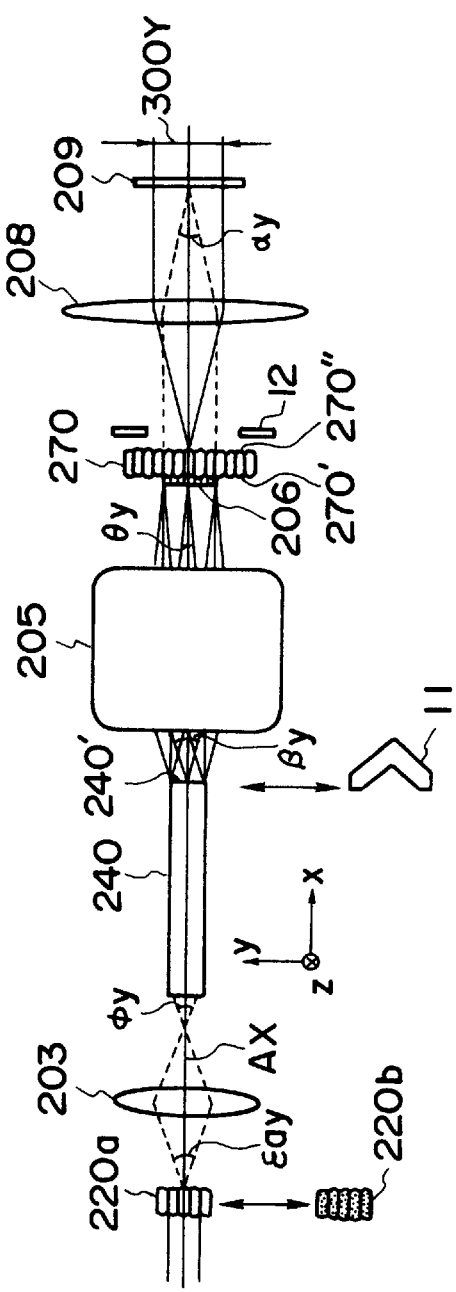
FIGS. 28A and 28B are schematic views, respectively, for explaining an illumination system according to a fifth embodiment of the present invention, in a state of small σ.
Figure 28B:
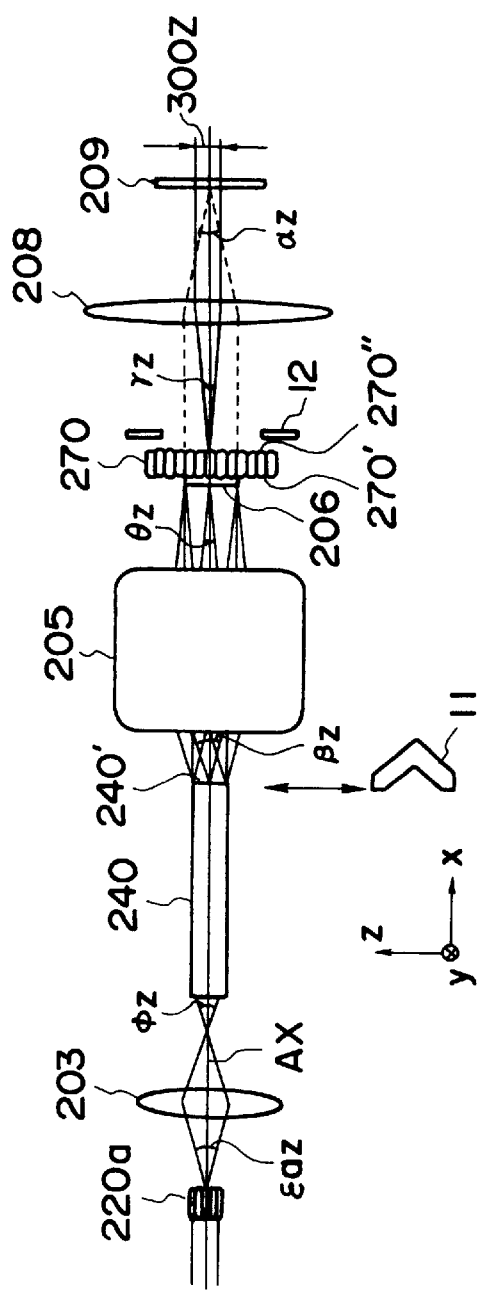
Figure 29A:
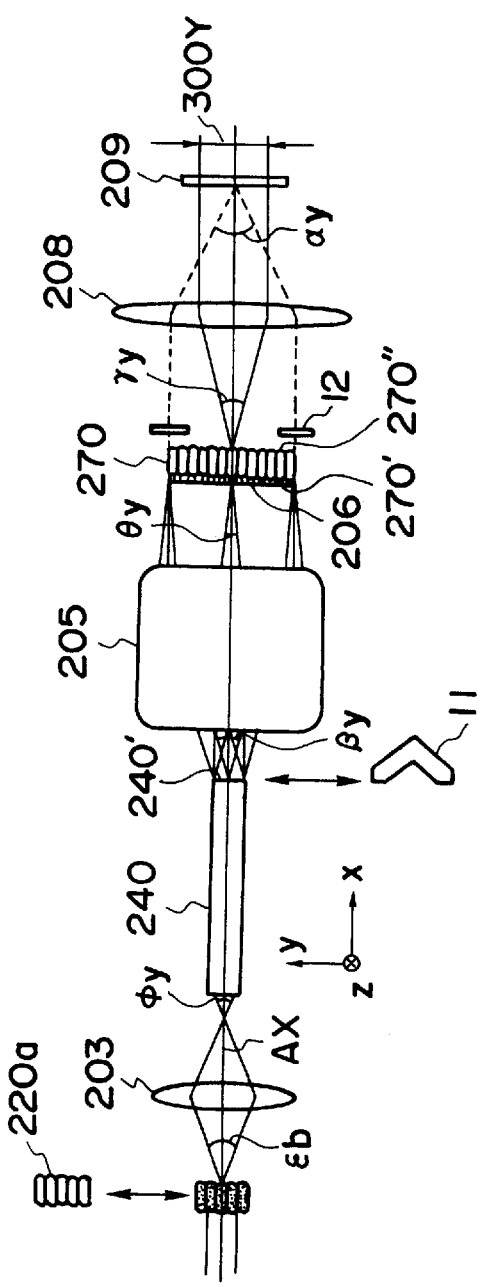
FIGS. 29A and 29B are schematic views, respectively, for explaining an illumination system according to a fifth embodiment of the present invention, in a state of large σ.
Figure 29B:
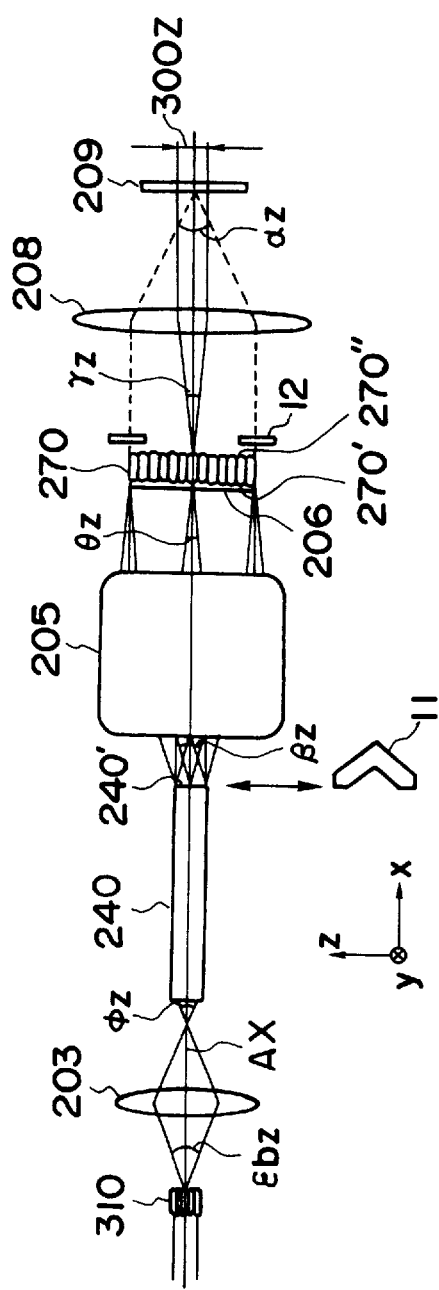

FIGS. 28A and 28B as well as FIGS. 29A and 29B are schematic views, respectively, each showing a main portion of an illumination system suitable for use in a step-and-scan type projection exposure apparatus for the manufacture of semiconductor chips such as LSI or VLSI, CCDs, magnetic sensors, or liquid crystal devices, for example. With reference to these drawings, a description will be made mainly on the differences of this embodiment as compared with the preceding embodiments.

FIGS. 28A and 28B show a case wherein the illumination system of this embodiment is in a small σ state as described. FIG. 28A is an illustration as viewed from the scan direction (hereinafter "Z direction"), and FIG. 28B is an illustration as viewed from a direction (hereinafter "Y direction") perpendicular to the scan direction. FIGS. 29A and 29B show a case wherein the illumination system of this embodiment is in a large σ state as described. FIG. 29A is an illustration as viewed from the z direction, and FIG. 29B is an illustration as viewed from the y direction.

In FIGS. 29A and 29B, the sectional plane containing the optical axis AX and an axis extending from the optical axis AX in the Y direction will be referred to as an "X-Y section", and the sectional plane containing an axis extending from the optical axis AX in the Z direction will be referred to as an "X-Z section".

In FIGS. 28A–29B, denoted at 220a and 220b are emission angle conservation optical elements having different opening angles (emission angles) of emitted light with respect to the X-Y section and X-Z section. Denoted at 240 is an inside reflection type integrator, and denoted at 270 is a wavefront division type integrator. Denoted at 270' and 270" are a light entrance surface and light exit surface of the wavefront division type integrator 270, respectively. Denoted at 300y is the length of the illumination region (light) upon the mask in the Y direction. Denoted at 300z is the length of the illumination region (light) upon the mask in the Z direction. Like numerals as those of FIGS. 22–27 are assigned to corresponding elements.

The basic structure and function of the illumination system of this embodiment shown in FIGS. 28A–29B are similar to those of the illumination system of the fourth embodiment having been described with reference to FIGS. 22–27. The illumination system of this embodiment differs from that of the fourth embodiment in the structure and function of the emission angle conservation optical element, the inside reflection type integrator and the wavefront division type integrator. Thus, the following description will be made mainly on these points.

In a step-and-scan type projection exposure apparatus, an illumination region of a rectangular slit shape extending in the Y direction (i.e., it is longer in the Y direction than in the Z direction) should be defined on the mask 209 efficiently.

In consideration of this, in the present embodiment, as regards the emission angle conservation optical element, optical elements 220a and 220b each comprising an anamorphic optical system having different focal lengths with respect to the X-Y section and X-Z section are used. Also, as regards the inside reflection type integrator, an integrator 240 comprising a quadrangle prism optical pipe member with a shape, in a sectional plane (hereinafter "Y-Z section") perpendicular to the optical axis, which shape can be represented by a pair of straight lines extending in the Y direction and a pair of straight lines extending in the Z direction, may be used. Further, as regards the wavefront division type integrator, an integrator 270 which comprises a fly's eye lens including small lenses each having a Y-Z sectional shape extending in the Y direction may be used.

In each of the emission angle conservation optical elements 220a and 220b, the focal length in the X-Y section is shorter than that in the X-Z section. Thus, the relation between the opening angles (emission angles) as viewed in these sections, is that the emission angle $\epsilon_{ay}$ or $\epsilon_{by}$ in the Y-Z section is larger than the emission angle $\epsilon_{az}$ or $\epsilon_{bz}$ in the X-Z section. As a result, among the opening angles (emission angles or incidence angles) $\phi_y$, $\phi_z$, $\beta_y$; $\beta_z$, $\theta_y$, $\theta_z$, $\gamma_y$, $\gamma_z$, $\alpha_y$ and $\alpha_z$, of lights illustrated, there are relations $\phi_y > \phi_z$, $\beta_y > \beta_z$, $\theta_y > \phi_z$, $\gamma_y > \gamma_z$, and $\alpha_y > \alpha_z$. Here, since $\gamma_y > \gamma_z$, a rectangular slit-like illumination region extending in Y direction can be defined on the mask 9.

Further, like the preceding embodiment, in dependence upon the magnitude of σ, there are relations $\epsilon_{ay} < \epsilon_{by}$ and $\epsilon_{az} < \epsilon_{bz}$. Also, in dependence upon the property of the prism-like light pipe, there are relations $\phi_y = \beta_y$ and $\phi_z = \beta_z$.

As regards the emission angle conservation optical elements 220a and 220b, a fly's eye lens which comprises small lenses arrayed two-dimensionally along the Y-Z section and having different focal lengths with respect to the X-Y section and X-Z section may be used. As regards the stop 221 of FIG. 23A, an element having a slit opening extending in the Y direction may be used. The small lenses of the fly's eye lens may be provided by ordinary lens elements or diffractive optical elements (Fresnel lenses).

Figure 30:
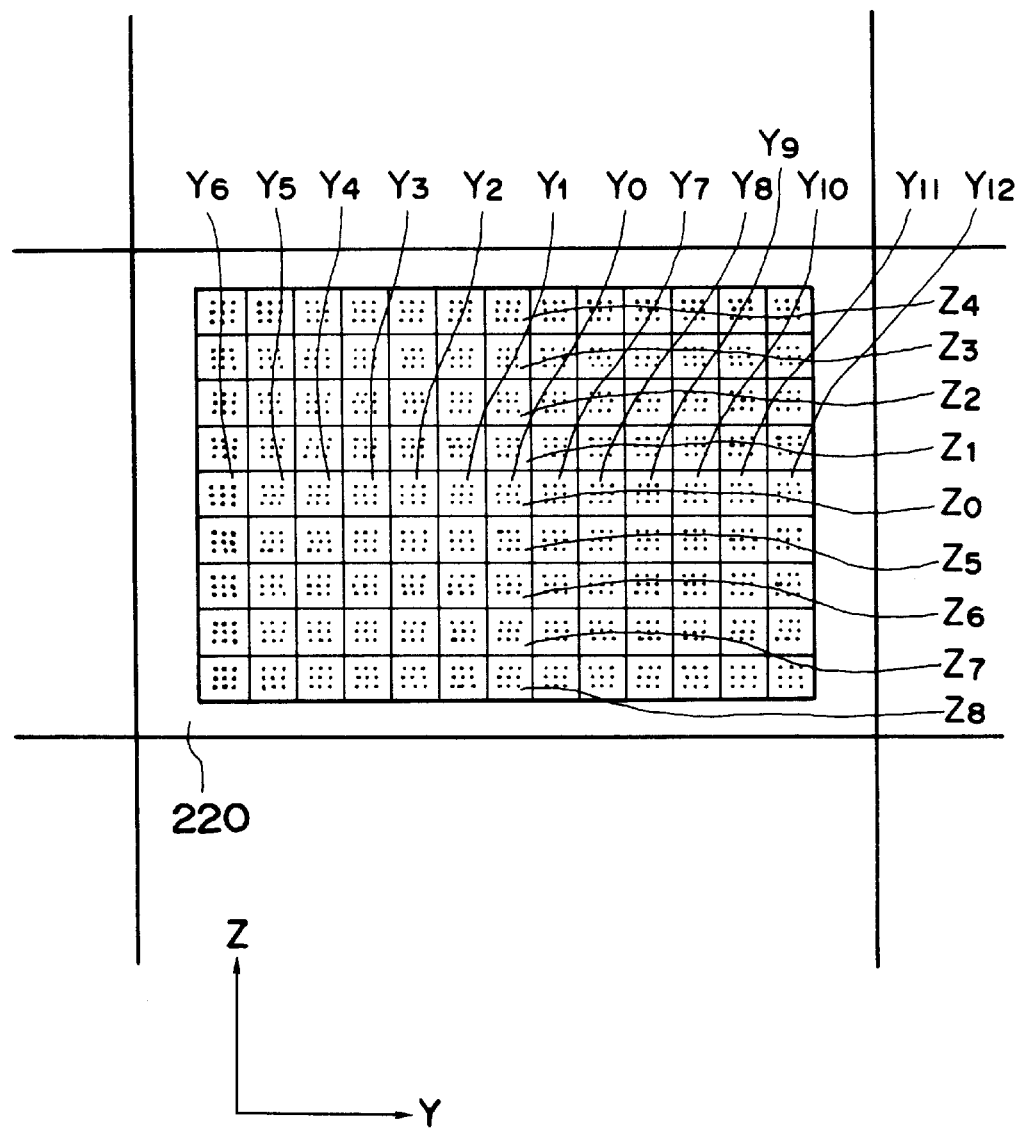
FIG. 30 is a schematic view for explaining a virtual image group as defined by an inside reflection type integrator 240.

FIG. 30 shows an arrayed virtual image group (apparent light source image group) as defined by the inside reflection type integrator 240 of FIGS. 28 and 29, as viewed from the light exit surface of one small lens constituting the wavefront division type integrator 270. Denoted in FIG. 30 at 320 is one small lens of the wavefront division type integrator 270, and denoted at Y1–Y12 and Z1–Z8 are virtual images.

It is seen from FIG. 30 that, because the inside reflection type integrator 240 comprises a quadrangle prism light pipe, the group of virtual images are arrayed in grid-like fashion along Y and Z directions. Also, since the incidence angle of divergent light entering the inside reflection type integrator 240 differs between the X-Y section and X-Z section, the number (times) of reflections at the inside reflection surface differs between the X-Y section and X-Z section. As a result, the number of virtual images differs between the Y and Z direction. These virtual images are images of a spot of focused laser light (point light sources) as defined between the condensing optical system 203 and the inside reflection type integrator 240.

In the illumination system of this embodiment, as shown in FIGS. 28 and 29, the emission angle conservation optical element 220a or 220b comprises a fly's eye lens having small lenses of a number m×n (m≧2 and n≧2), such that each of the virtual images consists of images divided in a number of about m×n. Thus, a virtual image comprising divided images arrayed in a grid-like shape can be observed, and this corresponds to one small lens of the wavefront division type integrator 270.

Thus, also in the illumination system of this embodiment, when light beams from point light sources (effective light sources) as defined at or adjacent to the light exit surface 270" of the wavefront division type integrator 270 are to be superposed by the condensing optical system 208 one upon another on the surface of the object 209, to be illuminated, to illuminate the object 209, there are a large number of point light sources (effective light sources) defined. This enables illumination of the object 209 with a uniform illuminance distribution over the object 209.

Like the preceding embodiment, also in the illumination system of this embodiment with the structure such as described above, for establishing a small σ state or large σ state in accordance with the type of the mask 209, only by exchanging magnification of the zooming optical system 205 between small and large values and by interchanging the emission angle conservation optical elements 220a and 220b, the values of angles $\alpha_y$ and $\alpha_x$ can be changed while keeping the values of angles $\theta_y$ and $\theta_z$ constant or substantially constant. Thus, σ can be changed without decreasing the light utilization efficiency. Further, there occurs no illuminance non-uniformness on the mask 209 even if the laser light from the laser light source shifts.

Figure 31:
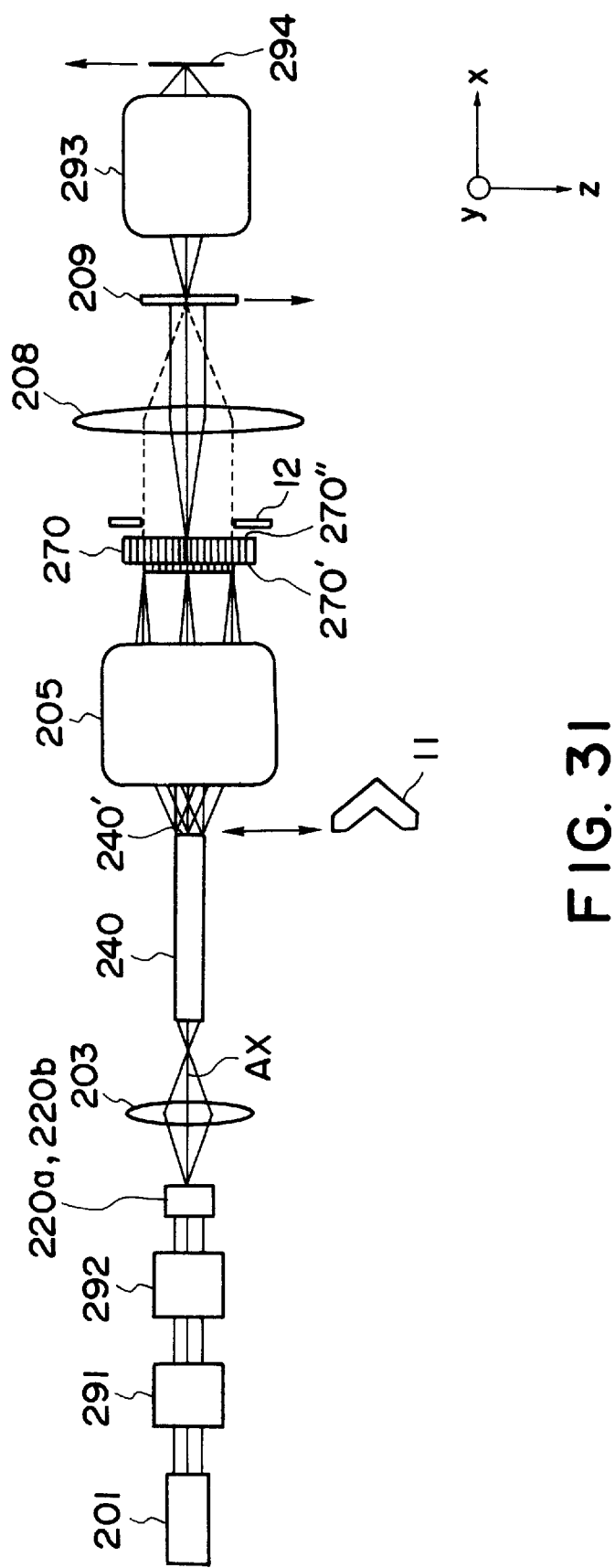
FIG. 31 is a schematic view of a main portion of an exposure apparatus including an illumination system of the FIGS. 28 or 29 embodiment.

FIG. 31 shows an embodiment wherein an illumination system having been described with reference to FIGS. 28–30 is applied to a step-and-scan type projection exposure apparatus for the manufacture of semiconductor chips-such as LSI or VLSI, CCDs, magnetic sensors, or liquid crystal devices, for example.

Denoted in FIG. 31 at 291 is a beam shaping optical system for transforming, into a desired beam shape, parallel light coming from a laser light source 201 such as a ArF excimer laser or a KrF excimer laser, for example Denoted at 292 is an incoherency transforming optical system for transforming coherent laser light into incoherent light. Denoted at 293 is a projection optical system for projecting a latent image or reduced image of a circuit pattern of a mask 209, for example. Denoted at 294 is a wafer having a substrate (silicon or glass) with a photosensitive material applied thereto. Like numerals as those of FIGS. 28–30 are assigned to corresponding elements, and a description thereof will be omitted.

The laser light from the laser light source 201 goes via a light guiding optical system comprising a mirror or relay lens (not shown), and it enters the beam shaping optical system 291. The beam shaping optical system 291 comprises cylindrical lenses or a beam expander, for example, and it serves to change the longitudinal-to-lateral ratio of the sectional shape of the laser light (perpendicular to the optical axis AX) to a desired value.

The light having its sectional shape adjusted by the beam shaping optical system 291 enters the incoherence transforming optical system 292 for preventing interference and speckle of light upon the wafer 294, such that it is transformed by the optical system 294 into incoherent light less causing speckle.

The incoherence transforming optical system 292 may have a structure such as disclosed in the aforementioned Japanese Laid-Open Patent Application, Laid-Open No. 215930/1991, for example.

The incoherent light from the incoherence transforming optical system 292 enters an emission angle conservation optical element 220a or 220b. In accordance with the procedure similar to that having been described with reference to the embodiment of FIGS. 22–26, lights emitted from the small regions (small lenses) of the wavefront division type integrator 270 are superposed one upon another by the condensing optical system 208, to illuminate the mask 209. Thus, the mask 209 is illuminated uniformly, such that a uniform illuminance distribution is produced over the whole circuit pattern surface of the mask 209 which is to be projected. Here, on the mask 209, there is produced a rectangular slit-like illumination region (light) extending in the Y direction. Then, the portion of the circuit pattern of the mask 209 where the illuminance region described above is defined, is projected and imaged by the projection optical system 293 onto the wafer 294. In this manner, the circuit pattern (image) is lithographically printed on the photosensitive material of the wafer 204.

The wafer 294 is held fixed by an X-Y-Z movable stage (not shown) through vacuum attraction, for example, the stage being movable in X, Y and Z directions. Also, the mask 209 is held fixed by another X-Y-Z movable stage (not shown) through vacuum attraction, for example, the stage being movable in the X, Y and Z directions. The movement of these X-Y-Z stages is controlled by use of distance measuring devices (not shown) based on laser interferometers, for example. In a state in which a rectangular slit-like illumination region is being defined at an end portion of the circuit pattern of the mask 209, the X-Y-Z stages are moved so as to scan the mask 209 in the Z direction and scan the wafer 294 in a negative Z direction. By this, the whole circuit pattern of the mask 209 can be projected to the wafer 294, and the whole circuit pattern is transferred to the wafer 294. If the projection optical system 293 has a projection magnification M and the scanning speed of the mask 209 is V, the scanning speed of the wafer is −M×V.

Figure 32:
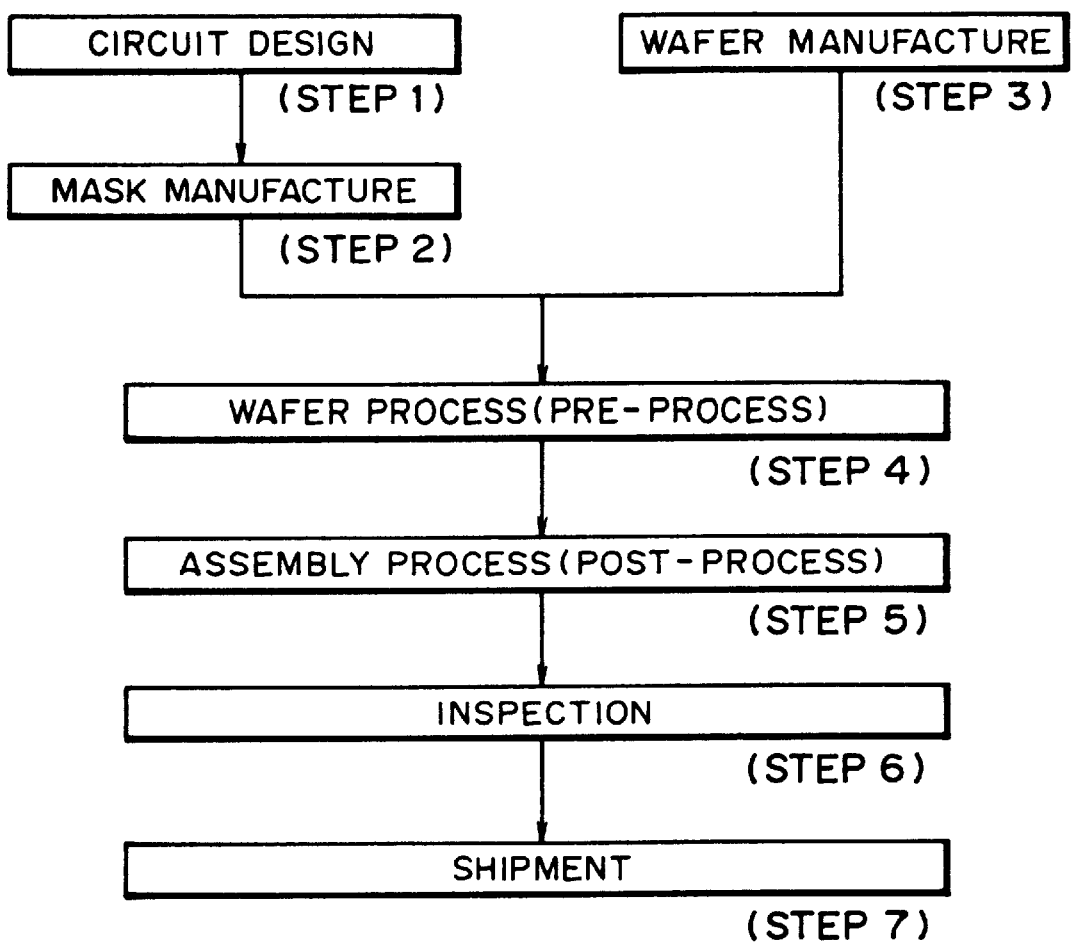
FIG. 32 is a flow chart of a device manufacturing method according to an embodiment of the present invention.

FIG. 32 is a flow chart of a procedure for the manufacture of microdevices such as semiconductor chips (e.g., ICs or LSIs), liquid crystal panels, or CCDs, for example, in accordance with an embodiment of the present invention.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which IC is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 33:
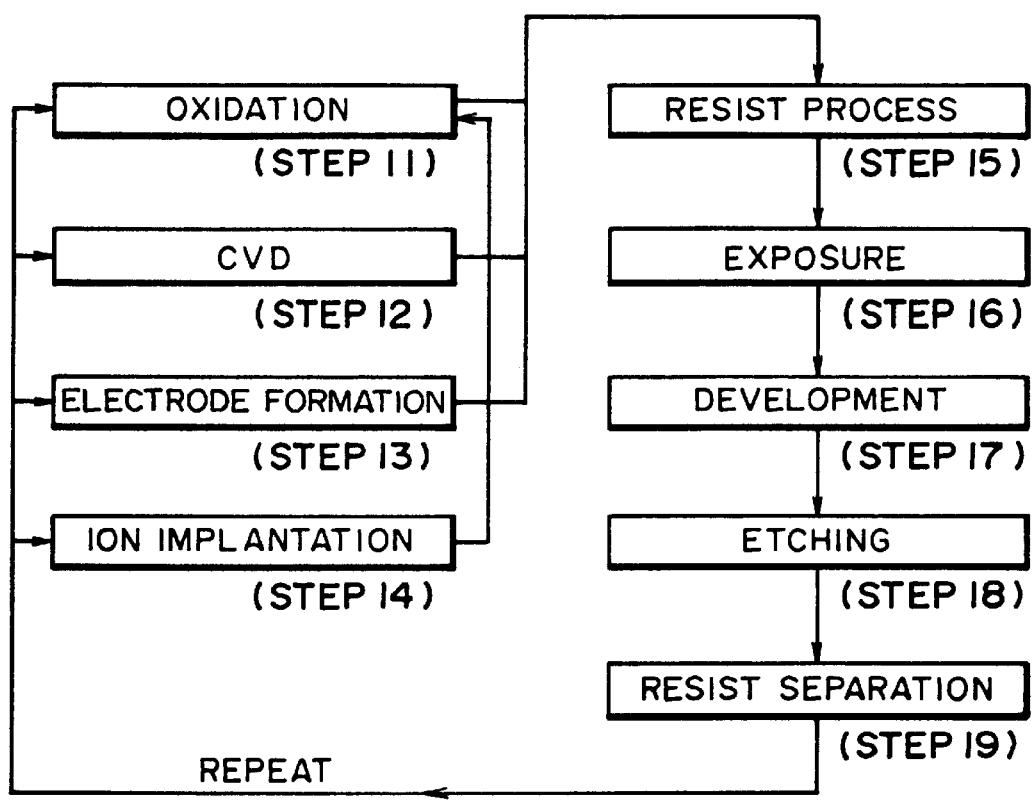
FIG. 33 is a flow chart for explaining details of a wafer process in the flow chart of FIG. 32.
Figure 34:
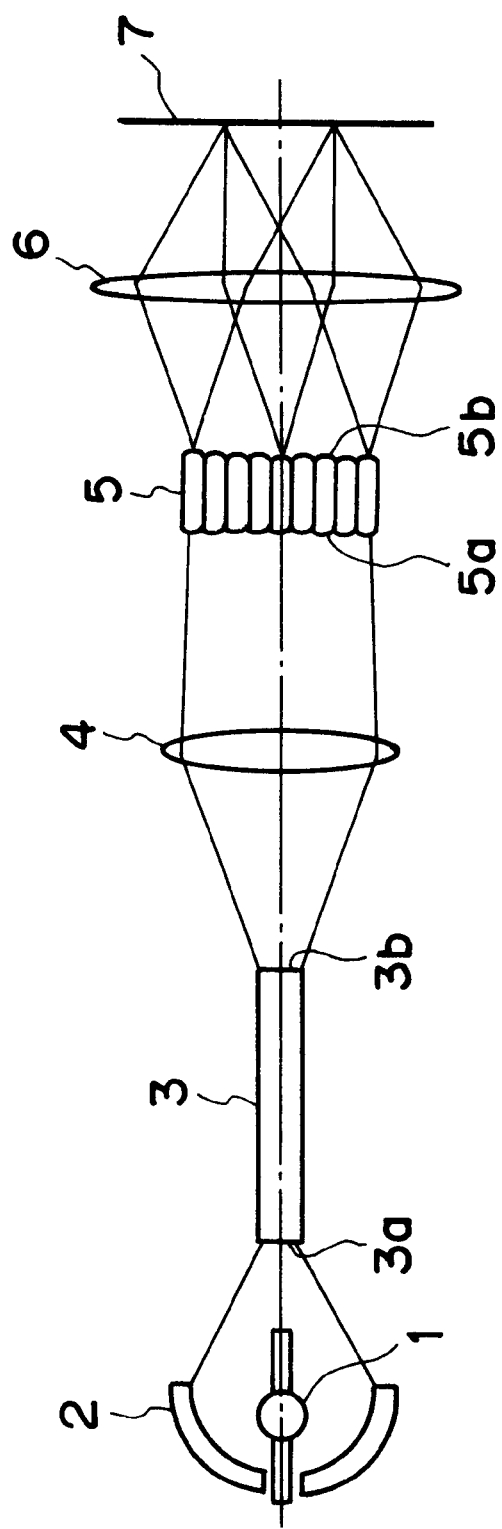
FIG. 34 is a schematic view of a main portion of an illumination system of a comparative example.
Figure 35:
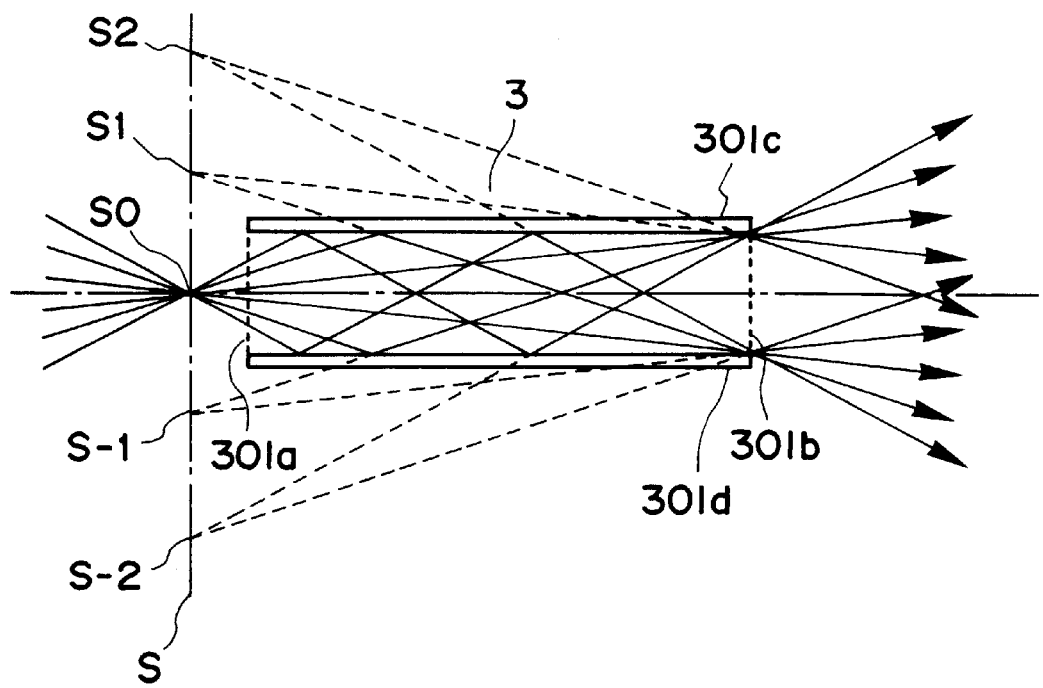
FIGS. 35–37 are schematic views, respectively, for explaining light mixing means of FIG. 34.
Figure 36:
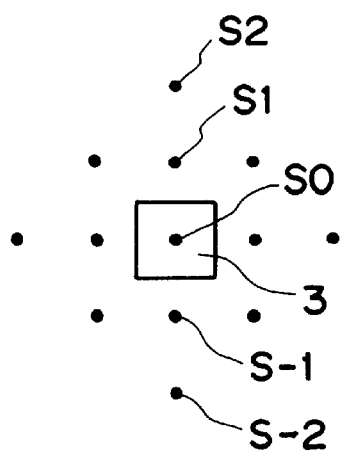
Figure 37:
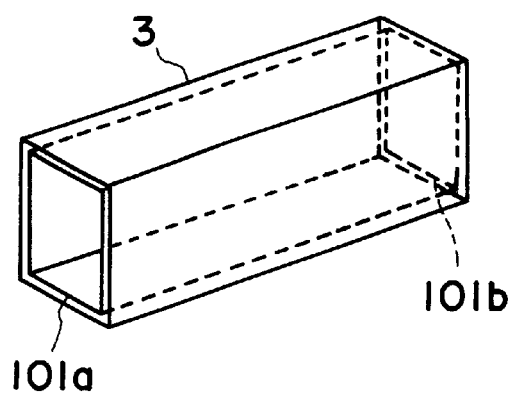

FIG. 33 is a flow chart showing details of the wafer process. Step 11 is an oxidation process for oxidizing the surface of a wafer. Step 12 is a CVD process for forming a insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. An illumination system, comprising:

light mixing means for mixing light from a light source on the basis of internal reflection, and for emitting the mixed light;

multi-beam producing means for wavefront dividing the light from said light mixing means and for producing plural light beams;

imaging means for forming an image of a light exit surface of said light mixing means on a light entrance surface of said multi-beam producing means;

illuminating means for illuminating a surface to be illuminated, with plural light beams from said multi-beam producing means in a state in which the light beams are superposed one upon another; and adjusting means, disposed between said light mixing means and said multi-beam producing means, for adjusting a light quantity distribution upon the light entrance surface of said multi-beam producing means.

2. An illumination system according to claim 1, further comprising collecting means for collecting light from the light source and for forming a light source image, wherein the light source image is formed at or adjacent to the light entrance surface of said light mixing means.

3. An illumination system according to claim 1, wherein said light mixing means includes an optical pipe.

4. An illumination system according to claim 1, wherein said multi-beam producing means includes a fly's eye lens.

5. An illumination system according to claim 1, wherein said adjusting means includes a prism member and said prism member is mounted into and demounted from a light path, by which the light quantity distribution on the light entrance surface of said multi-beam producing means is adjusted.

6. An illumination system according to claim 5, wherein said prism member has a conical surface being concave at its light entrance side and convex at its light exit side.

7. An illumination system according to claim 5, wherein said prism member has a polygonal pyramid surface being concave at its light entrance side and convex at its light exit side.

8. An illumination system according to claim 5, wherein said prism member has a polygonal pyramid surface being concave at its light entrance side and convex at its light exit side, and a flat surface defined by cutting the peak of the polygonal pyramid surface along a plane perpendicular to an optical axis.

9. An illumination system according to claim 1, wherein said adjusting means includes a diffractive optical element and said diffractive optical element is mounted into and demounted from a light path, by which the light quantity distribution on the light entrance surface of said multi-beam producing means is adjusted.

10. An illumination system according to claim 9, wherein said diffractive optical element has a ring-like phase distribution.

11. An illumination system according to claim 9, wherein said diffractive optical element has a plurality of rectilinear phase distributions intersecting perpendicularly at adjoining distribution regions.

12. An illumination system according to claim 1, further comprising a stop disposed at or adjacent to a light exit surface of said multi-beam producing means, wherein said adjusting means adjusts the light quantity distribution on a light entrance surface of said multi-beam producing means in accordance with an aperture shape of said stop.

13. An illumination system, comprising:

a first optical integrator of an inside reflection type, for reflecting at least a portion of received light by its inside surface and for defining a plane light source at or adjacent to a light exit surface thereof;

a second optical integrator of a wavefront division type, for dividing the wavefront of received light and for defining plural light sources at or adjacent to a light exit surface thereof;

an imaging optical system for imaging said plane light source at or adjacent to a light entrance surface of said second optical integrator;

a collecting optical system for superposing lights from said plural light sources one upon another on a surface to be illuminated; and adjusting means, disposed between said first optical integrator and said second optical integrator, for adjusting a light quantity distribution upon the light entrance surface of said second optical integrator.

14. An illumination system according to claim 13, wherein said imaging optical system includes optical elements which are movable to change the imaging magnification.

15. An illumination system according to claim 13, wherein said imaging optical system includes optical systems having different imaging magnifications which can be selectively inserted between said first and second optical integrators to change the imaging magnification.

16. An illumination system according to claim 13, further comprising a directing optical system for directing light from a light source to said first optical integrator, said directing optical system including an optical member operable to maintain, substantially constant, a divergence angle or a convergence angle of light to be emitted from said optical member irrespective of a shift of the position of incidence of the light from the light source in a direction perpendicular to an optical axis.

17. An illumination system according to claim 16, wherein said optical member includes a third optical integrator of a wavefront division type for dividing a wavefront of received light and for defining plural light sources at or adjacent to a light exit surface thereof.

18. An illumination system according to claim 16, wherein said optical member includes a lens and a stop having an aperture smaller than the diameter of said lens.

19. An illumination system according to claim 16, wherein said directing optical system includes a plurality of said optical members, which are arranged to emit light with different divergence or convergence angles, and wherein said plurality of optical members can be selectively disposed on a light path in accordance with a change in said imaging magnification to maintain, substantially constant, the numerical aperture of light impinging on said second optical integrator irrespective of the change in imaging magnification.

20. An illumination system according to claim 16, wherein said optical member includes plural optical elements which are displaceable to change a focal length in accordance with a change in said imaging magnification such that the numerical aperture of light impinging on said second optical integrator can be maintained substantially constant irrespective of a change in said imaging magnification.

21. An illumination system according to claim 16, wherein said optical member is arranged to produce lights having different divergence angles or convergence angles with respect to two orthogonal sectional planes.

22. An illumination system, comprising:
    a wavefront division type optical integrator for dividing a wavefront of received light and for defining plural light sources at or adjacent to a light exit surface thereof;
    an illumination optical system of a variable focal length for directing light from a light source to a light entrance surface of said wavefront division type optical integrator, wherein a change in focal length of said illumination optical system is contributable to change at least one of a size and an intensity distribution of light from the light source upon said wavefront division type optical integrator;
    a collecting optical system for superposing lights from said plural light sources one upon another on a surface to be illuminated; and
    adjusting means for adjusting a light quantity distribution upon the light entrance surface of said wavefront division type optical integrator,
    wherein said illumination optical system is operable to correct the numerical aperture of light impinging on said wavefront division type optical integrator as changed with the change in focal length.

23. An illumination system according to claim 22, wherein said illumination optical system includes (i) an inside reflection type optical integrator for reflecting at least a portion of received light by its inside surface and for defining a plane light source at or adjacent to a light exit surface thereof, and (ii) an imaging optical system of a variable focal length, for imaging the plane light source at or adjacent to a light entrance surface of said wavefront division type optical integrator, wherein a change in focal length of said imaging optical system is contributable to change an imaging magnification of said imaging optical system.

24. An illumination system according to claim 23, wherein said imaging optical system includes plural optical elements which are displaceable to change the imaging magnification.

25. An illumination system according to claim 23, wherein said imaging optical system includes optical systems having different imaging magnifications which can be selectively inserted between said inside reflection type optical integrator and said wavefront division type optical integrator to change the imaging magnification.

26. An illumination system according to claim 23, wherein said illumination optical system includes an optical member of a variable focal length disposed on a light path between said light source and said inside reflection type optical integrator, wherein the focal length of said optical member can be changed in accordance with a change in focal length of said imaging optical system to correct a change in numerical aperture of light impinging on a light entrance surface of said wavefront division type optical integrator.

27. An illumination system according to claim 26, wherein (i) said optical member includes plural optical components for emitting lights with different divergence angles or convergence angles, (ii) one of said plural optical components can be disposed on a light path between said light source and said inside reflection type optical integrator, and (iii) said one optical component can be replaced by another optical component in accordance with a change in focal length of said imaging optical system to correct a change in numerical aperture of light impinging on the light entrance surface of said wavefront division type optical integrator.

28. An illumination system according to claim 27, wherein said optical member includes plural wavefront division type optical integrators each for dividing a wavefront of received light and for defining plural light sources at or adjacent to a light exit surface thereof.

29. An illumination system according to claim 26, wherein said optical member includes plural optical elements which are displaceable to change a focal length thereof in accordance with a change in focal length of said imaging optical system to correct a change in numerical aperture of light impinging on the light entrance surface of said wavefront division type optical integrator.

30. An illumination system according to claim 26, wherein said optical member emits lights having different divergence angles or convergence angles with respect to two orthogonal sectional planes.

31. An illumination system, comprising:
    a first optical integrator of a wavefront division type, for dividing the wavefront of received light and for defining plural light sources at or adjacent to a light exit surface thereof;
    a second optical integrator of an inside reflection type, for reflecting at least a portion of received light by its inside surface and for defining a plane light source of a uniform intensity distribution, at or adjacent to a light exit surface thereof;
    a third optical integrator of a wavefront division type, for dividing the wavefront of received light and for defining plural light sources at or adjacent to a light exit surface thereof;
    a first imaging optical system for imaging the plural light sources, defined by said first optical integrator, at or adjacent to a light entrance surface of said second optical integrator;
    a second imaging optical system for imaging said plane light source, defined by said second optical integrator, at or adjacent to a light entrance surface of said second optical integrator;
    a collecting optical system for superposing lights from said plural light sources, defined by said third optical integrator, one upon another on a surface to be illuminated; and
    adjusting means for adjusting a light quantity distribution upon the light entrance surface of said third optical integrator.

32. An illumination system according to claim 31, wherein said first optical integrator emits lights having different divergence angles or convergence angles with respect to two orthogonal sectional planes.

33. An exposure apparatus for transferring, by exposure, a pattern of a mask onto a wafer, said apparatus comprising:

an illumination system, as recited in any one of claims 1–32, for illuminating the mask; and a projection optical system for projecting the pattern of the mask onto the wafer, to transfer the pattern of the mask onto the wafer.

34. A device manufacturing method, comprising the steps of:

applying a resist to a wafer;

providing an exposure apparatus as recited in claim 33;

transferring, by exposure through the projection optical system of the exposure apparatus, a pattern of a mask onto the wafer; and developing the exposed wafer.

* * * * *

UNITED STATES PATENT AND TRADEMARK OFFICE
CERTIFICATE OF CORRECTION

PATENT NO.   : 6,259,512 B1
DATED        : July 10, 2001
INVENTOR(S)  : Satoru Mizouchi It is certified that error appears in the above-identified patent and that said Letters Patent is hereby corrected as shown below:

Column 2,
Line 28, "these-virtual" should read -- these virtual --.

Column 4,
Line 10, "directing-light" should read -- directing light --.

Column 5,
Line 30, "intensity an" should read -- an intensity --; and
Line 36, "intensity" should read -- an intensity --.

Column 7,
Line 3, "FIG. 3B" should read -- FIG. 3B, --;
Line 35, "hatched-regions" should read -- hatched regions --.
Line 39, "the-stop" should read -- the stop --.

Column 8,
Line 30, "FIG. 6 in" should read -- FIG. 6 is --.

Column 9,
Line 30, "the." should read -- the --.

Column 10,
Line 15, "Adjusting" should read -- adjusting --; and
Line 61, "on" should read -- on an --.

Column 11,
Line 8, "as of" should read -- as -- ; and
Line 31, "and" should read -- and a --.

Column 16,
Line 40, "of" should be deleted; and
Line 42, "of" should be deleted.

Column 18,
Line 15, "at" should read -- of --.

Column 20,
Line 33, "in Y" should read -- in the Y --.

UNITED STATES PATENT AND TRADEMARK OFFICE
CERTIFICATE OF CORRECTION

PATENT NO.   : 6,259,512 B1
DATED        : July 10, 2001
INVENTOR(S)  : Satoru Mizouchi It is certified that error appears in the above-identified patent and that said Letters Patent is hereby corrected as shown below:

Column 21,
Line 27, "$\alpha_y$" should read -- $\alpha_z$ --;
Line 36, "chips-such" should read -- chips such --;
Line 41, "a ArF" should read -- an ArF --; and
Line 42, "example" should read -- example. --.

Signed and Sealed this

Fourteenth Day of May, 2002

Attest:

JAMES E. ROGAN
Attesting Officer
Director of the United States Patent and Trademark Office